United States Patent [19]
Nakamura

[11] Patent Number: 5,345,414
[45] Date of Patent: Sep. 6, 1994

[54] SEMICONDUCTOR MEMORY DEVICE HAVING FERROELECTRIC FILM

[75] Inventor: Takashi Nakamura, Kyoto, Japan

[73] Assignee: Rohm Co., Ltd., Kyoto, Japan

[21] Appl. No.: 5,070

[22] Filed: Jan. 15, 1993

[30] Foreign Application Priority Data

Jan. 27, 1992 [JP] Japan .................................. 4-012177
Jan. 27, 1992 [JP] Japan .................................. 4-012178

[51] Int. Cl.⁵ .......................................... G11C 11/22
[52] U.S. Cl. .................................... 365/145; 365/218
[58] Field of Search ........... 365/117, 145, 174, 189.01, 365/218; 257/295

[56] References Cited

U.S. PATENT DOCUMENTS 3,426,255  2/1969  Heywang ............................. 365/145
4,669,062  5/1987  Nakano ................................ 365/174

FOREIGN PATENT DOCUMENTS 201998  8/1988  Japan .
64993  3/1990  Japan .

OTHER PUBLICATIONS

Baker, Stan, "Ferroelectric Chips", *VLSI Systems Design*, May 1988, pp. 116, 117 and 120-123.

Primary Examiner—Joseph A. Popek
Attorney, Agent, or Firm—Steven M. Rabin

[57] ABSTRACT

The invention is directed to a semiconductor memory device which uses a field effect transistor having a ferroelectric gate film to store data therein. A storing field effect transistor is connected to a reading transistor in series. The storing field effect transistor has its gate connected to a writing and erasing transistor. In writing data, the writing and erasing transistor is made conductive, and writing voltage is applied to the gate of the storing field effect transistor through the writing and erasing transistor. This permits a polarization of the ferroelectric gate film to have a direction corresponding to data to be written. There is no need of controlling a potential at a semiconductor substrate provided with the storing field effect transistor in writing data, and therefore, no undesired voltage is applied to any other elements formed in the semiconductor substrate.

61 Claims, 11 Drawing Sheets

SEMICONDUCTOR MEMORY DEVICE HAVING FERROELECTRIC FILM

BACKGROUND OF THE INVENTION

1. Field of the Invention

The present invention relates to a nonvolatile semiconductor memory device having a ferroelectric film applied to EEPROM (Electrically Erasable/Programmable Read Only Memory), and the like.

2. Description of the Prior Art

When an electric field is applied to a ferroelectric substance like PZT (Lead(Pb) Ziroconate Titanate), for example, a polarization direction is aligned to the direction of the electric field. This state of directional alignment remains after the electric field is dissipated. That is, a polarization of the ferroelectric substance occurs with a hysteresis characteristic when applying an electric field. Thus, such hysteresis characteristic can be utilized to design a nonvolatile memory.

FIG. 8 is a diagram showing the variation in polarization when an electric field is applied to a ferroelectric substance. As the electric field is increasingly applied to the ferroelectric substance, polarization P increases in a direction equivalent to that of the electric field, and when the electric field having $E_{sat}$ or over in strength is applied, this results in saturation represented by A in FIG. 8. Then, as the electric field is reduced, the polarization P decreases but still remains under zero electric field to make a state represented by B. Moreover, when an electric field in a reverse direction is applied, the polarization P decreases, then it reaches zero under a certain negative electric field. With further application of the reverse electric field, the polarization P increases in the reverse direction, and it assumes saturation represented by C with the applied electric field of more than $-E_{sat}$ in strength. When the negative electric field is reduced from this saturation state C, the polarization P still remains under zero electric field to make a state represented by D in FIG. 8. Increasing the positive electric field beginning at this state, the polarization P ultimately presents the saturation state A.

Nonvolatile memory devices utilizing such a hysteresis characteristic of ferroelectric substances are disclosed, for example, in "Ferroelectric Chips (VLSI SYSTEM DESIGN, MAY 1988, PP.116–123, S. BAKE)" and Japanese Unexamined Patent Publication No. 201998/1988. Those documents disclose a nonvolatile memory device having a memory cells aligned in a matrix manner, each of which can store one bit of data, and a structure of each memory cell is shown in FIG. 9 herein. The memory cell includes a ferroelectric capacitor 1 and a switching MOSFET (Metal Oxide Semiconductor Field Effect Transistor) 2.

Without application of an electric field, a ferroelectric substance sandwiched between plates of the ferroelectric capacitor 1 presents a state represented by B or D in FIG. 8. The correlations between states B, D and logic status "1" and "0" are predetermined. For example, when the ferroelectric substance presents the state B, applying positive voltage VP in a form of pulse via the switching MOSFET 2 to the capacitor 1 causes almost no current to flow into the capacitor 1. In this situation, the ferroelectric substance temporarily presents the state A and then recovers the state B. Otherwise, when the ferroelectric substance presents the state D, applying the positive voltage VP in the form of pulse to the capacitor 1 causes relatively large current to flow into the capacitor 1. In this situation, the ferroelectric substance temporarily presents the state A and thereafter turns to the state B.

Thus, the amount of the current flowing into the capacitor 1 may be monitored while the switching MOSFET 2 is rendered conductive, so as to find whether the ferroelectric substance between the plates of the capacitor 1 presents the state B or the state D. This allows data stored in the memory cell to be read. Writing or erasing data can be conducted by charging or discharging the capacitor 1 to invert the polarization direction in the ferroelectric substance between plates of the capacitor 1.

When a reading operation is performed with the ferroelectric substance in the state D, the ferroelectric substance turns to the state B. This means that reading data from the memory cell results in the destruction of the data in the memory cell. For this reason, in the previously mentioned structure, stored data must be regenerated each time data is read out.

As mentioned above, however, by destroying and regenerating data stored in the memory cell whenever data is read therefrom, there arise more inversions of the polarization directions in the ferroelectric substance between the plates of the capacitor 1. As a result, fatigue advances more quickly in the ferroelectric substance, and a less number of times can the data be reloaded. In order to find the current state of the ferroelectric substance based upon the amount of the current flowing into the capacitor 1 when a voltage plus is applied, movement of sufficient electric charges is needed. In other words, it is necessary that the capacitor 1 contains accumulated electric charges (about 30 fF) equivalent to those contained in each memory cell of a DRAM (Dynamic Random Access Memory) in the state B or the state D where residual polarization occurs. This is why the ferroelectric substance of the capacitor 1 requires residual polarization having a a voltage plus to some extent, which, in turn, results in a smaller choice of ferroelectric substances. Furthermore, for the capacitor 1 to have a larger capacity it should have a larger area, and therefore, there lie limitations to the degree to which the above-mentioned memory cells can be miniaturized. Accordingly, it is difficult to use those memory cells to fabricate an integrated memory.

To overcome those disadvantages, there has been proposed a technology that a memory cell contains an MFSFET (Metal Ferroelectric Semiconductor Field Effect Transistor). Such an MFSFET has a sectional configuration as illustrated in FIG. 10. Specifically, a pair of N-type impurity diffusion layers SD are formed at a specified interval in the vicinity of a surface of a P-type silicon substrate SUB so as to be a source and a drain. A ferroelectric gate film 4 is formed in contact with the surface of the substrate SUB between the pair of diffusion layers SD. A conductive thin film 3 is formed on the ferroelectric gate film 4 so as to act as a gate electrode. In this way, an MFS structure, surrounding the ferroelectric gate film 4, is built.

A layer insulating film 5 is formed covering the conductive thin film 3 and the surface of the substrate SUB. Holes are formed in the layer insulating film 5 at upper portions of the diffusion layers SD so as to act as contact holes, through which source and drain electrodes 6 come into contact with the diffusion layers SD.

When a voltage $V_{max}$ ($>0$) by which an electric field $E_{sat}$ or greater in FIG. 8 can be applied to the ferroelectric gate film 4 is applied to the conductive thin film 3, the ferroelectric gate film 4 turns to the state A. In this situation, a channel connecting the pair of diffusion layers SD is formed in the surface of the substrate SUB just beneath the ferroelectric gate film 4. After that, turning the voltage at the conductive thin film 3 to zero, causes the ferroelectric gate film 4 to presents the state B in FIG. 8. That is, the channel still lies since polarization remains. Otherwise, when voltage at a level of $-V_{max}$ is applied to the conductive thin film 3 (or when the voltage of $+V_{max}$ is applied to the substrate), the ferroelectric gate film 4 turns to the state C. While it turns to the state C, the channel dissipates. Then, when voltage applied to the conductive thin film 3 is zero, the ferroelectric gate film 4 turns to the state D. While it is in the state D, the channel still dissipates.

Thus, if appearance and disappearance of the channel are related so as to correspond to logical status "0" and "1", respectively, nonvolatile storage can be constructed. Since reading of stored data can be performed by checking whether the MFSFET is conductive or a non-conductive, reading operation can be performed without the destruction of the stored data. Accordingly, this MFSFET, if applied to a memory cell, the number of times it may reloaded, compared with the memory cell shown in FIG. 9.

Residual polarization required for the ferroelectric gate film 4 to control the existence or non-existence of the channel just beneath the ferroelectric gate film 4 is as relatively small as 1 $\mu C/cm^2$ or less. For this reason, there is a large choice of substances suitable for the ferroelectric gate film 4. Simply important is controlling existence or non-existence of the channel between the source and drain, and therefore, the ferroelectric gate film 4 does not have to have a large area, which enables the memory cell to be miniaturized. This eventually enables an integrated memory to be fabricated easily.

An exemplary structure of a memory cell where the MFSFET is used is shown in FIG. 11. In this memory cell, an MFSFET 7 has its source and drain connected to switching MOSFETs 8 and 9 in series, respectively, and these three transistors together constitute a memory cell. The switching MOSFET 8 has its source connected to a bit line BL and has its gate supplied with voltage from a first word line WL1. Moreover, Vcc/2 which is a half of a definite voltage Vcc is applied to a gate of the MFSFET 7 and a drain of the switching MOSFET 9, respectively. When the voltage Vcc/2 is applied between the gate of the MFSFET 7 and a substrate, the polarization direction of ferroelectric gate film contained in the MOSFET 7 can be inverted. Furthermore, the switching MOSFET 9 has its gate supplied with voltage from a second word line WL2.

Japanese Unexamined Patent Publication No. 64993/1990, for example, discloses a nonvolatile memory having such memory cells aligned in a matrix manner on a semiconductor substrate.

Writing and reading in and from such a memory will be described. First, in writing, a potential at the first word line WL1 is set to Vcc to turn ON the MOSFET 8 while a potential at the word line WL 2 is set to ground potential Vss to turn OFF the MOSFET 9. In this state, voltage corresponding to data is applied from the bit line BL to the source of the MFSFET 7 and a semiconductor substrate. For example, when the ground potential is applied to the bit line BL, the voltage Vcc/2 is applied between the gate of the MFSFET and the substrate with the gate being on the positive side. Consequently, an electric field having a direction from the gate to the substrate is applied to a ferroelectric gate film of the MFSFET 7 to align polarization in the ferroelectric gate film the direction of the electric field. Alternatively, when the potential Vcc is applied to the bit line BL, the voltage Vcc/2 is applied between the gate of the MFSFET 7 and the substrate with the substrate being on the positive side. Consequently, an electric field having a direction from the substrate toward the gate is applied to the ferroelectric gate film of the MFSFET 7 to align the polarization in the ferroelectric gate film the direction of the electric field.

Thus, the ferroelectric gate film contained in the MFSFET 7 can be controlled to be in the state B or the state D in FIG. 8 by applying voltage corresponding to data to the bit line BL. In this way, the MFSFET 7 can be switched between conductive and non-conductive states under control so as to execute data writing.

On the other hand, in reading, a potential higher than the potential Vcc/2 is applied in advance to the bit line BL from a precharge circuit (not shown). In this situation, the voltage Vcc is applied to the word lines WL1 and WL2 to turn both of the MOSFETs 8 and 9 ON. At this time, if the MFSFET 7 is in its conductive state, current flows from the bit line through the MOSFET 8, MFSFET 7 and MOSFET 9 to reduce the potential at the bit line BL. If the MFSFET 7 is not conductive, no current flows, and the potential at the bit line BL stays unchanged. Then, a potential variation at the bit line BL is amplified by a sense amplifier (not shown) and then detected so as to execute data reading. In this case, however, disturbance caused by the reading may greatly affect the polarization in the ferroelectric gate film of the MFSFET 7, and in order to avoid this, a precharge level at the bit line BL must be set to a potential close to Vcc/2.

In a nonvolatile memory employing memory cells as described above, voltage for inverting a polarization in the ferroelectric gate film must be applied between the gate of the MFSFET 7 and the semiconductor substrate. For the purpose, a well 7a is formed in each memory cell in arranging the memory cells on the semiconductor substrate. Controlling the potential at the well 7a attains application of an electric field for data writing to the ferroelectric gate film of the MFSFET 7.

In such a structure, however, applying voltage to the well 7a in any of the memory cells selected in advance causes the voltage to slightly be applied to the wells 7a in the remaining memory cells through the semiconductor substrate. This results in an undesirable weak electric field being applied to the ferroelectric gate film of the MFSFET 7 in each of the non-selected memory cells. Such a weak electric field cannot invert the polarization direction in the ferroelectric gate film in the non-selected memory cell but causes the so-called soft write in the non-selected memory cell; that is, a slight change in the polarization in the ferroelectric gate film is caused.

It now is assumed that the MFSFET 7 in the memory cell where the soft write occurs turns ON. Then, in the case where the pair of switching MOSFETs 8 and 9 are made conductive to read data from the memory cell, drain current in the MFSFET 7 is smaller than the ordinary one, and hence the reliability of data reading is accordingly decreased.

In addition to that, the weak voltage applied to the well 7a in the non-selected memory cell is unstable one which depends upon whether data written in the selected memory cell is "1" or "0", and it takes a indefinite value. Thus, there has been no useful way to prevent such soft write in the non-selected memory cell.

SUMMARY OF THE INVENTION

Accordingly, it is an object of the present invention to provide a nonvolatile semiconductor memory device, having a ferroelectric film which is capable of reading stored data without destruction and which is capable of enhancing reliability of reading, and a method of driving the semiconductor memory device.

The semiconductor memory device according to the present invention includes a storing field effect transistor having ferroelectric gate film, a reading transistor connected to the field effect transistor in series, and a writing and erasing transistor connected to a gate of the storing field effect transistor.

In such an arrangement, gate voltage of the storing field effect transistor having ferroelectric gate film can be controlled through the writing and erasing transistor. Specifically, even if the storing field effect transistor is formed on a semiconductor substrate, voltage applied to the ferroelectric gate film of the storing field effect transistor can be controlled with a potential at the semiconductor substrate remaining constant. Thus, voltage sufficient to write or erase data can be applied to the gate of the storing field effect transistor through the writing and erasing transistor so as to control the direction of a polarization of the ferroelectric gate film.

As mentioned above, the potential at the semiconductor substrate can be kept constant in writing data, and hence, even in the case where other devices are formed on the semiconductor substrate, writing data in the memory never affect those devices. For example, if a plurality of memory cells are formed each of which includes the storing field effect transistor, the reading transistor, and the writing and erasing transistor on the semiconductor substrate, there is no danger, in writing data in one memory cell, of applying an electric field to the ferroelectric gate film of the storing field effect transistor in each of other memory cells. This can prevent the so-called soft write. More specifically, no change arises in a polarization in the ferroelectric gate film of a storing field effect transistor other than in a memory cell in which data is being written.

Data reading is accomplished by checking whether a series circuit consisting of the storing field effect transistor and the reading transistor becomes generally conductive when the reading transistor is made conductive. Such data reading never destroys stored data.

Moreover, since no soft write arise as stated above, the polarization in the ferroelectric gate film of the storing field effect transistor, where once data has been written, is stable. Hence, the reading can be performed with high reliability.

The foregoing and other objects, features and effects of the present invention will become more fully apparent in the following detailed description if taken in conjunction with the accompanying drawings.

DESCRIPTION OF THE PREFERRED EMBODIMENTS

Figure 1:
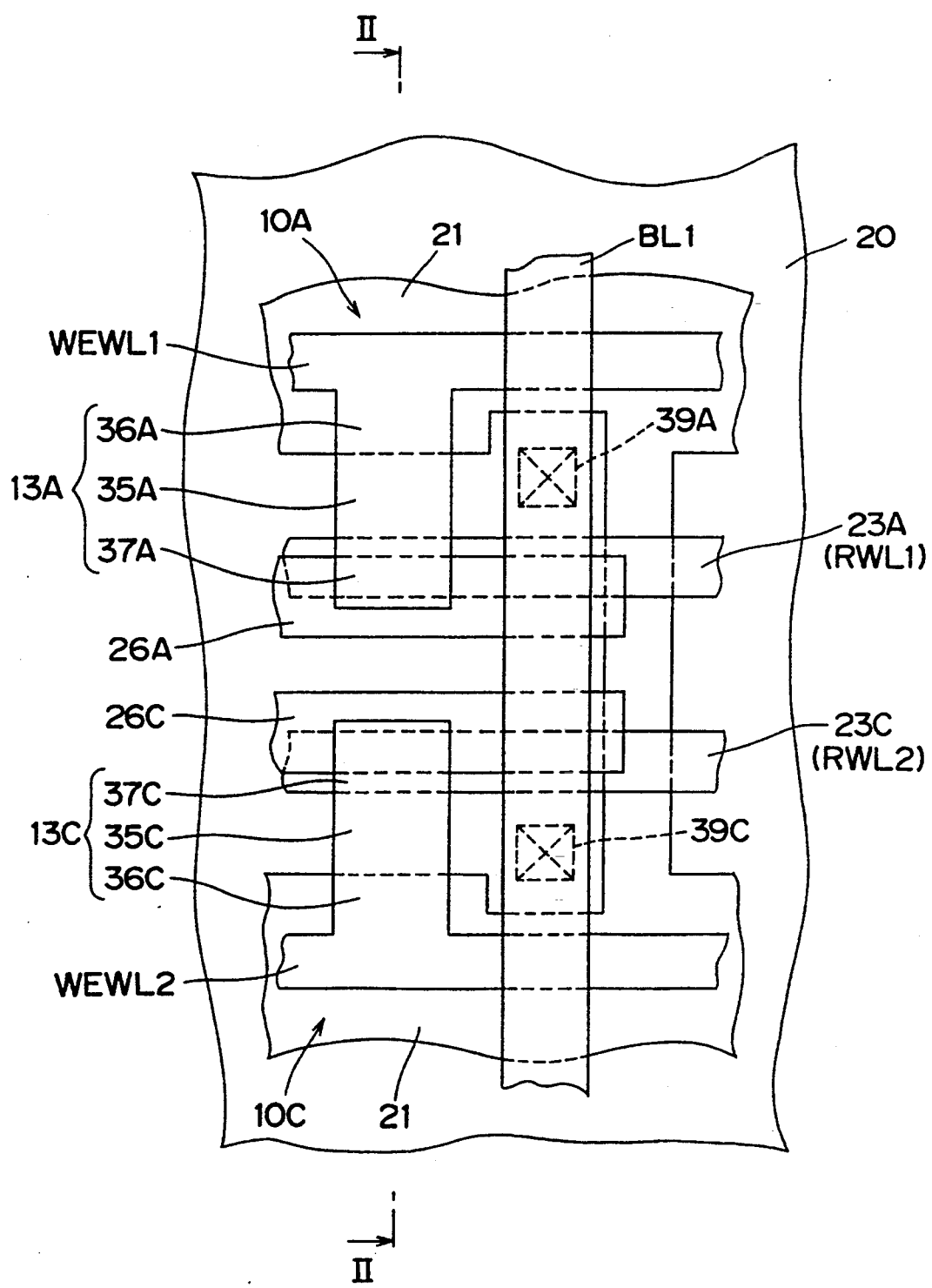
FIG. 1 is a plan view showing in part a nonvolatile semiconductor memory device of an embodiment according to the present invention.
Figure 2:
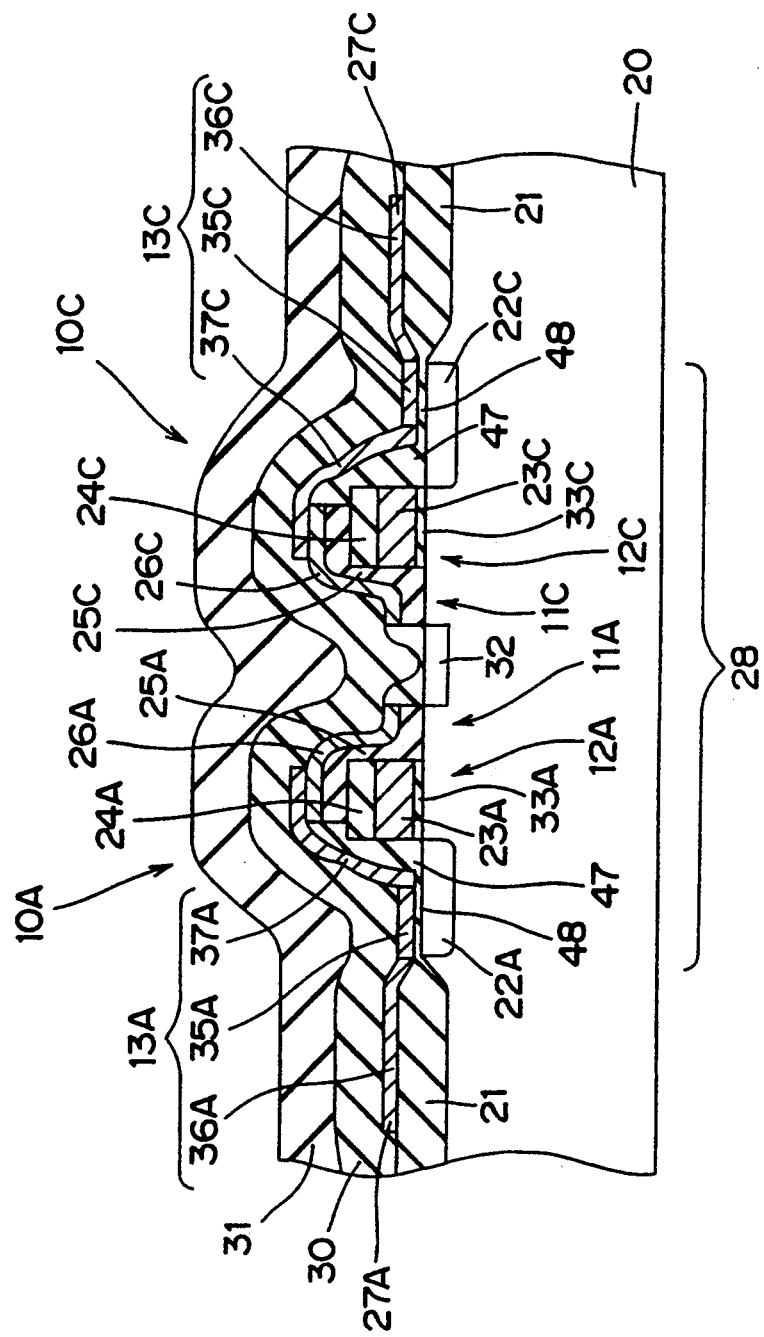
FIG. 2 is a sectional view taken along the line II—II of FIG. 1.

FIG. 1 is a plan view showing in part an architecture of a semiconductor memory device of a preferred embodiment according to the present invention, and FIG. 2 is a sectional view taken along the line II—II of FIG. 1. The semiconductor memory device illustrated is a nonvolatile memory device having memory cells arranged in a matrix manner on a surface of a P-type silicon substrate 20. FIGS. 1 and 2 show configurations of two memory cells 10A and 10C adjacent to each other in a column direction. All components related to the memory cell 10A are denoted by alphanumeric characters with a capitalized letter "A" while all components related to the memory cell 10C are denoted by alphanumeric characters with a capitalized letter "C". Among those components, those which are denoted by the alphanumeric characters with the same numerals have the same functions.

An active region 28 is formed close to a surface of the P-type silicon substrate 20, isolated by a field oxide film 21. In the active region 28 a pair of N-type impurity diffused layers 22A and 22C are formed at specified intervals, and an N-type impurity diffused layer 32 is formed in position between the impurity diffused layers 22A and 22C. The adjacent memory cells 10A and 10C share the impurity diffused layer 32.

Since the memory cells 10A and 10C are identical in configuration to each other, the configuration of the memory cell 10A alone will be described below.

Between the N-type impurity diffused layers 22A and 32, there are provided on the surface of the substrate 20 a gate oxide film 33A, a gate electrode 23A and a layer insulating film 24A, are laminated close to the diffused layer 22A in the recited order. A ferroelectric gate film 25A is formed, extending over from the layer insulating film 24A to the surface of the substrate 20 close to the diffused layer 32. A conductive thin film 26A is formed on the ferroelectric gate film 25A. The gate electrode 23A extends in a certain direction to act as a reading word line RWL1.

A semiconductor film 27A is formed, having its one end in contact with an end of the conductive thin film 26A above the gate electrode 23A. The semiconductor thin film 27A is extended up to a position on the field oxide film 21, and furthermore, it extends in the shape of a belt or band on the field oxide film 21 (see FIG. 1). The band-shaped part of the semiconductor thin film 27A extending on the field oxide film 21 acts as a writing and erasing word line WEWL1. A side wall 47 and an insulating film 48, both of which are made of insulating substance, are provided between the semiconductor thin film 27A and the gate 23A, between the semiconductor thin film 27A and the N-type impurity diffused layer 22A, and so forth.

The semiconductor thin film 27A constitutes an N channel MOSTFT (Metal Oxide Semiconductor Thin Film Transistor) 13A acting as a writing and erasing transistor. Impurity is selectively injected into the conductive thin film 26. A channel region 35A is provided above the N-type diffused layer 22A, and a drain region 36A and a source region 37A are provided in contact with both sides of the channel region 35A. In such a configuration, a potential at the N-type impurity diffused layer 22A can be controlled so as to control appearance/disappearance of a channel in the channel region 35A. The N-type impurity diffused layer 22A can act as a gate of the MOSTFT 13A. The N-type impurity diffused layer 22A, as shown in FIG. 1, is connected to a bit line BL1 in a contact hole 39A.

At a position where the gate electrode 23A is formed, an inversion layer can appear or disappear in the surface of the substrate 20 depending upon the voltage applied to the gate electrode 23A; that is, in an area where the gate electrode 23A is formed, an N channel MOSFET (Metal Oxide Semiconductor Field Effect Transistor) 12A corresponding to a reading transistor is formed.

Also at a position where the ferroelectric gate film 25A comes in contact with the substrate 20, there may arise two sorts of stable condition where the inversion layer appears and disappears in the substrate 20 depending upon the polarization in the ferroelectric gate film 25A. The polarization of the ferroelectric gate film 25A can be inverted by applying voltage of a predetermined value or greater between the conductive thin film 26A and the substrate 20. Thus, it may be said that an N channel MFSFET (Metal Ferroelectric Semiconductor Field Effect Transistor) 11A, acting as a storing field effect transistor, is formed in an area where the ferroelectric gate film 25A is in contact with the substrate 20.

In FIG. 2, reference numeral 30 designates a layer insulating film, and reference numeral 31 designates a surface protection film. The films 30 and 31 are omitted in FIG. 1.

Figure 3:
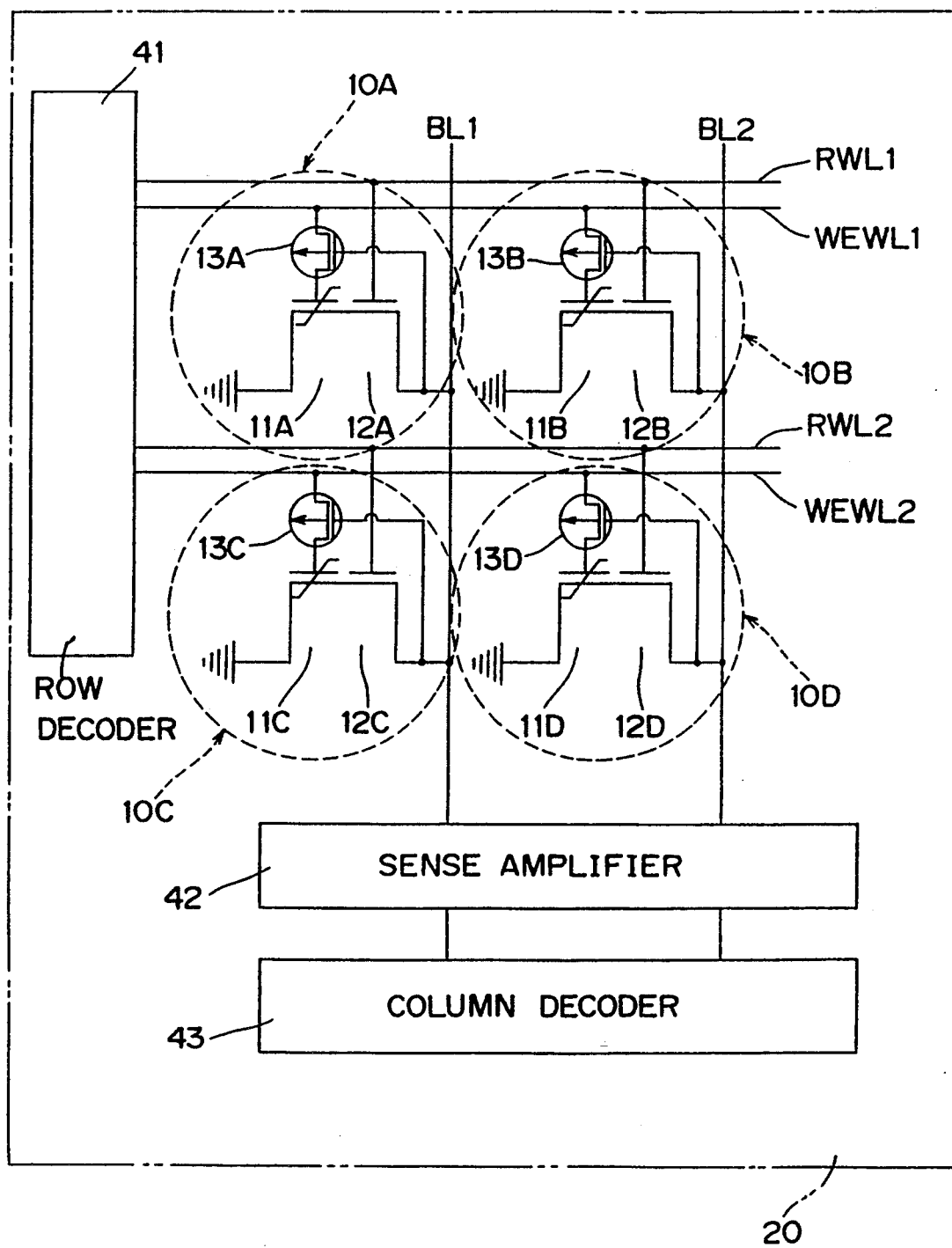
FIG. 3 is a circuit diagram showing in part the nonvolatile semiconductor memory device.

FIG. 3 is a circuit diagram showing in part the above-mentioned nonvolatile memory device. Although merely four of the memory cells 10A, 10B, 10C and 10D (referred to as "memory cell 10" en bloc hereinafter), arranged on the silicon substrate 20 are shown in FIG. 3, approximately 100,000 to 1,000,000 memory cells 10 are actually disposed on the silicon substrate 20 in a matrix array, i.e., aligned in rows and columns a matrix manner. Reference symbols including "A", "B", "C" or "D" denote components related to any of the memory cells 10A, 10B, 10C and 10D, respectively. The components denoted by alphanumeric characters including the same numerals have the same functions.

The memory cells 10A, 10B, 10C, 10D and so forth, include the MFSFETs 11A, 11B, 11C, 11D and so forth (referred to as "MFSFET 11" en bloc hereinafter), each of which has ferroelectric gate film, reading MOSFETs 12A, 12B, 12C, 12D and so forth (referred to as "MOSFET 12" en bloc hereinafter), connected in series respectively with gates of the MFSFETs 11A, 11B, 11C, 11D and so forth, and writing and erasing MOSTFTs 13A, 13B, 13C, 13D and so forth (referred to as "MOSTET 13" en bloc hereinafter), connected to each gate of the MFSFETs 11A, 11B, 11C, 11D and so forth.

The MFSFET 11 and the MOSFET 12 share a source and a drain. In another point of view, the MFSFET 11 and the MOSFET 12 are formed of a single MOS-type transistor having its gate divided into two. Specifically, the single MOS-type transistor has its gate divided into two on a source side and a drain side. The drain side of the divided gate includes a silicon oxide film for an insulating film while the the source side includes a ferroelectric film for the insulating film. In such a structure, two transistors, namely, the MFSFET and the MOSFET, can be formed in a small area required for forming a single MOS-type transistor.

The MOSTFTs 13A, 13B, 13C, 13D and so forth have their respective drains connected to the writing/erasing word lines WEWL1, WEWL2 and so forth, respectively. The MOSFETs 12A, 12B, 12C, 12D and so forth have their respective gates connected to the reading word line RWL1, RWL2 and so forth, respectively, and their respective drains connected to the bit lines BL1, BL2 and so forth, respectively. As mentioned above, since the N-type diffused layer 22A to act as the drain of the MOSFET 12A also acts as gates of the MOSTFT 13A, this is electrically equivalent to the MOSTFTs 13A, 13B, 13C, and so forth having their respective gates connected to the drains of the MOSFETs 12A, 12B, 12C, 12D and so forth, respectively. The ground potential is applied to each source of MFSFETs 11A, 11B, 11C, 11D and so forth.

The writing/erasing word lines WEWL1, WEWL2, and so forth and the reading word lines RWL1, RWL2 and so forth are connected to a row decoder 41. The bit lines BL1, BL2 and so forth are connected to a sense amplifier 42 and a column decoder 43.

A method of driving the above-mentioned nonvolatile memory will be described. A conductive state of each of the MFSFETs 11A, 11B, 11C, 11D and so forth corresponds to a logic "1" while a non-conductive state corresponds to a logic "0".

The Table 1 below shows voltage applied to various elements when the memory cell 10A is selected to write or erase data in the memory cell 10A, and when the stored data is read from the memory cell 10A.

TABLE 1

|  | WEWL1 | WEWL2 | RWL1 | RWL2 | BL1 | BL2 |
| --- | --- | --- | --- | --- | --- | --- |
| READ | 0 | 0 | Vcc | 0 | SA | 0 |
| WRITE | Vpp | 0 | 0 | 0 | Vcc | 0 |
| ERASE | −Vpp | 0 | 0 | 0 | Vcc | 0 |

Reading

In reading data from the memory cell 10A, the column decoder 43 supplies current SA to the bit line BL1. This allows the drain of the MOSFET 12 of every memory cell 10 connected to the bit line BL1 to be supplied with the current SA. In this state, the MOSTFTs 13A and 13C are kept in their non-conductive states, respectively.

The row decoder 41 applies voltage Vcc (>0) to the reading word line RWL1 in order to select the memory cell 10A. This allows the voltage Vcc to be applied to the gate of the MOSFET 12 of every memory cell 10 connected to the word line RWL1. This, in turn, permits the MOSFET 12A of the memory cell 10A to turn ON.

If data stored in the memory cell 10A is "1" to make the MFSFET 11A conductive, a potential at the bit line BL1 drops to the ground potential. If the data stored in the memory cell 10A is "0" to make the MFSFET 11A non-conductive, the potential at the bit line BL1 never drops. Thus, a variation in the voltage at the bit line BL1 may be amplified and detected by the sense amplifier 42 so as to read data in the memory cell 10A.

At this time, the ground potential is applied to the word line WEWL1, and the MOSTFT 13A is kept in the non-conductive state, as stated above. Then, no electric field is applied to the ferroelectric gate film 25A, and therefore, there arises no change in the polarization in the ferroelectric gate film 25A. Thus, data reading from the memory cell 10A can be performed without destruction of data stored in the memory cell 10A.

Additionally, since the ground potential is applied to the word line RWL2, the MOSFETs 12C and 12D are kept in their non-conductive states in the memory cells 10C and 10D, respectively. Since no current is supplied to the bit line BL2, a variation in the potential at the bit line BL2 will never be detected by the sense amplifier 42. Thus, data stored in the non-selected memory cells 10B, 10C, 10D and so forth are never read therefrom.

If the current SA is supplied commonly to the bit lines BL1 and BL2, data stored in the memory cells 10A, 10B and so forth aligned in the row direction can be read in parallel.

Writing

In writing data "1" in the memory cell 10A, the row decoder 41 and the column decoder 43 apply the ground potential to all the lines except for the word line WEWL1 and the bit line BL1. The row decoder 41 applies programming voltage Vpp (>0) to the writing/erasing word line WEWL1. This allows the programming voltage Vpp to be applied to the drain of the MOSTFT 13 of every memory cell 10 connected to the word line WEWL1. The column decoder 43 applies the voltage Vcc to the bit line BL1. This allows the voltage Vcc to be applied to the drain of the MOSFET 12 of every memory cell 10 connected to the bit line BL1. As a result, since the MOSTFT 13A becomes conductive, the programming voltage Vpp is applied from the word line WEWL1 to the ferroelectric gate film 25A of the MFSFET 11A of the memory cell 10A. In this case, a polarization is caused in the ferroelectric gate film 25 with its positive side closer to the substrate 20. This causes an inversion layer to be generated in a surface region of the substrate 20 with which the ferroelectric gate film 25A is in contact. Thus, the MFSFET 11A becomes conductive, and the data "1" is written in the memory cell 10A.

Since the ground potential is applied to the bit line BL2 at this time, the MOSTFT 13B and 13D in the memory cells 10B and 10D are respectively kept in their non-conductive states. Thus, no electric field is applied to the ferroelectric gate film of each of the MFSFET 11B and 11D in the memory cells 10B and 10D. Although the MOSTFT 13C becomes conductive in the memory cell 10C, the word line WEWL2 holds the ground potential. Thus, also in the memory cell 10C, no electric field is applied to the ferroelectric film of the MFSFET 11C. Since an electric field is never applied to the ferroelectric gate film of each of the MFSFETs in the non-selected memory cells 10B, 10C, 10D as has been described, no data writing is performed in those non-selected memory cells. Also, no electric field is applied to the ferroelectric gate film of any MFSFET of the non-selected memory cells at all, and therefore, no soft write is caused in the non-selected memory cells. Thus, data in the non-selected memory cells can be assuredly retained.

When the data "0" is written in the memory cell 10A, the ground potential is applied to the word line WEWL1. Thus, if the data stored in the memory cell 10A is initialized (erased) to be "0" before writing, the data stored in the memory cell 10A is kept "0" after the writing.

Erasing

Erasing is an operation of making the stored data "0"; that is, the erasing is basically similar to the writing. The former is different from the latter simply in that erasing voltage $-Vpp$ of which polarity is inverted from the programming voltage Vpp is applied to the word line WEWL1. This causes the erasing voltage $-Vpp$ different in polarity from the voltage in the writing to be applied to the drain of the MOSTFT 13 of every memory cell 10 connected to the word line WEWL1. Thus, a polarization is caused in the ferroelectric gate film 25A with its negative portion closer to the substrate 20, and the MFSFET 11A becomes its non-conductive state. This, in turn, forces the data stored in the memory cell 10A to be "0", and erasing the stored data is accomplished.

Since the voltage $-Vpp$ is not applied to the ferroelectric gate film of any MFSFET 11 of the non-selected memory cells 10 but applied to the memory cell 10A alone at this time, data in the non-selected memory cells 10 are not erased. Thus, the erasing can be executed bit-by-bit, as the writing and reading.

If the erasing voltage $-Vpp$ is applied not only to the word line WEWL1 but to other word lines WEWL2 and so forth in erasing data, data stored in a column of memory cells 10 which share the bit line BL1 can be erased together en bloc.

If the voltage Vcc is applied not only to the bit line BL1 but also to the other bit lines BL2 and so forth, data stored in a row of memory cells 10 which share the word line WEWL1 can be erased together en bloc.

Moreover, if the erasing voltage $-Vpp$ is applied to all the writing/erasing word lines WEWL1, WEWL2 and so forth while the voltage Vcc is applied to all the bit lines BL1, BL2, and so forth, data stored in all the memory cells 10 can be erased together en bloc.

As has been described, in an arrangement according to the present invention, not the control of the potential at the substrate 20 but the control of the potential at the gate electrode (conductive thin film 26A) of the MFSFET 11A through the MOSTFT 13A is practiced to apply an electric field to the ferroelectric gate film 25A. Thus, it is needless to provide a well for controlling the potential at the substrate 20 for each memory cell 10. Consequently, the fabrication process can be simplified, and a required area of the substrate 20 can be reduced.

The potential at the substrate 20 is always kept at the ground potential, and therefore, in writing, erasing or reading data in or from certain one of the memory cells 10, an undesired weak electric field is never applied to the ferroelectric gate film of the MFSFET 11 in any of the remaining of the memory cells 10. Thus, the so-called soft write in the non-selected memory cell 10 can be effectively prevented. Consequently, in reading data, sufficient current flows in the MFSFET 11 if the MFSFET 11 is conductive. In this way, reliability in the reading can be enhanced.

Furthermore, in the arrangement according to the present invention, the channel region 35A of the MOSTFT 13A is insulated from the substrate 20. This is why voltage of any polarity, positive or negative, can be applied to the gate of the MFSFET 11 through the MOSTFT 13A. Thus, the direction of the polarization in the ferroelectric gate film of the MFSFET 11 can be well inverted with the potential at the silicon substrate 20 kept at the ground potential, and hence writing or erasing data can be executed well.

The MOSTFT 13A is formed of the semiconductor thin film 27A provided on the substrate 20. This enables the memory cell 10 to be miniaturized, compared with a case where a transistor corresponding to the MOSTFT 13 is formed in the silicon substrate 20. Thus, such a configuration is advantageous for a reduction of an area of the substrate 20. Moreover, the MOSTFT 13A is, for example, formed in a region on or above the field oxide film 21 and the N-type impurity diffused layer 22A. This enables a further reduction of the area of the memory cell 10.

In this embodiment, the MFSFET 11A and the MOSFET 12A share a source and a drain. This is also helpful in a further miniaturization of the memory cell.

FIGS. 4A through 4J are sectional views illustrating a method of manufacturing the above-mentioned non-volatile memory device in order of process steps, each of which shows the memory cell 10A.

Figure 4A:
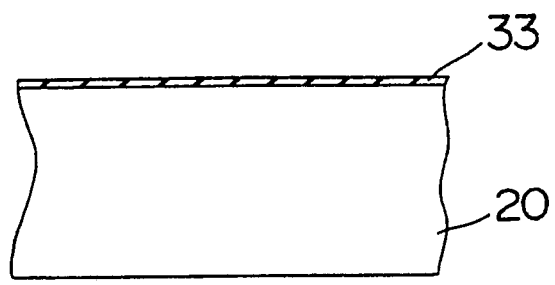
FIGS. 4A through 4J are sectional views illustrating manufacturing steps of the nonvolatile semiconductor memory device in order.

First, as shown in FIG. 4A, a thermal oxidation causes the surface of the P-type silicon substrate 20 to make a thin oxide film 33.

Figure 4B:
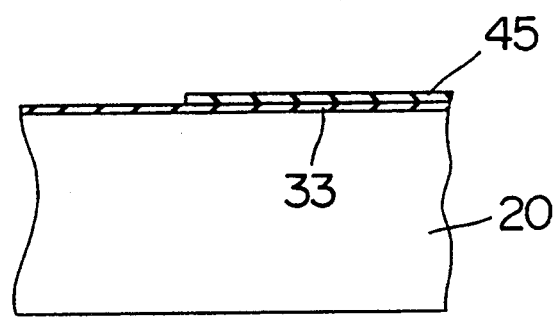

Then, as shown in FIG. 4B, a silicon nitride film 45 is selectively formed in an area corresponding to an active region 28 on a surface of the oxide film 33.

Figure 4C:
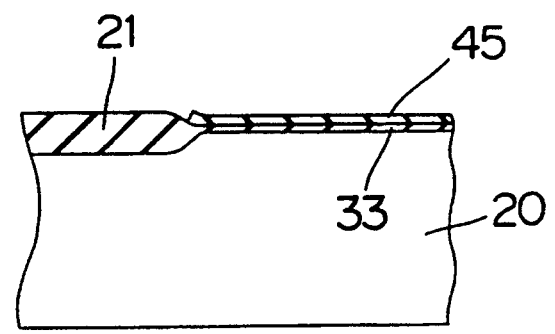

The resultant substrate is further subjected to a thermal oxidation process to further grow the oxidation film 33 in an area where there lies no silicon nitride film 45, as shown in FIG. 4C, and eventually, a field oxide film 21 is formed. In this way, an active region is separated by means of LOCOS (Local Oxidation of Silicon).

Figure 4D:
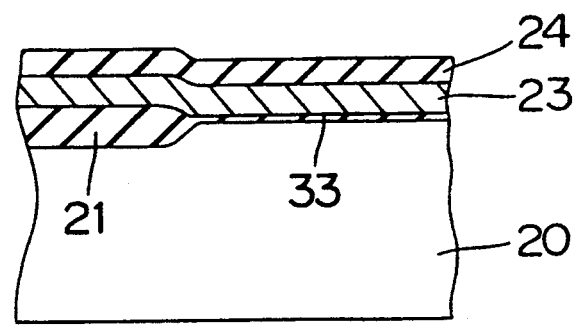

Next, the silicon nitride film 45 is removed, and thereafter a metal film 23 and an insulating film 24 are deposited in order as shown in FIG. 4D.

Figure 4E:
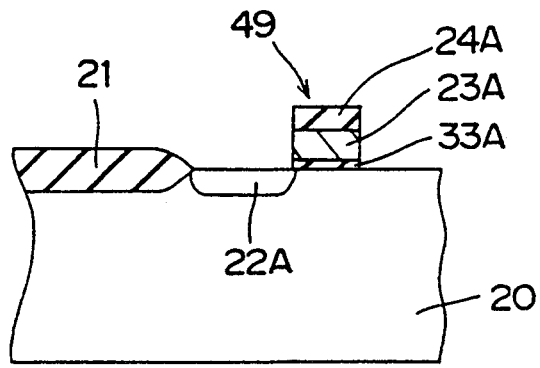

Moreover, as shown in FIG. 4E, the oxide film 33, the metal film 23, and the insulating film 24 are patterned to shape the gate oxide film 33A, the gate electrode 23A, and the layer insulating film 24A, respectively. A lamination 49 consisting of those films is utilized as a mask, and ions are implanted to make an N-type impurity diffused layer 22A in self-alignment. In this case, an appropriate mask is provided to an area contiguous to the lamination 49 and opposite to the N-type impurity diffused layer 22A so as not to implant any ion.

Although the layer insulating film 24A is formed on the gate electrode 23A, this is because the polarization in the ferroelectric gate film 25A formed in a later step is prevented from being varied by the voltage applied to the gate electrode 23A. Thus, it is preferable using a substance of low dielectric constant, such as silicon oxide, for the layer insulating film 24.

Figure 4F:
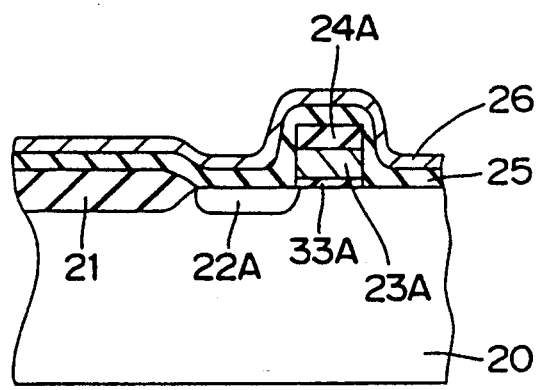
Figure 4G:
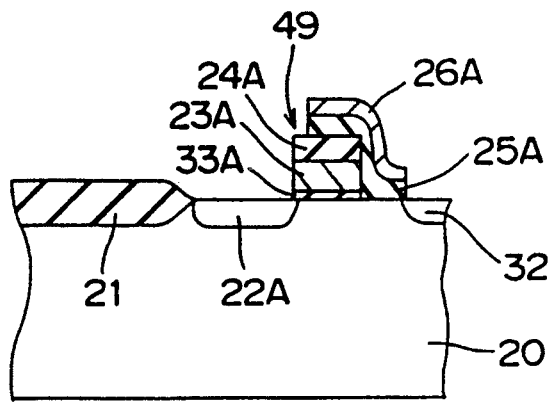

After that, as shown in FIG. 4F, the ferroelectric film 25 and the conductive thin film 26 are deposited in order. Then, as shown in FIG. 4G, the ferroelectric film 25 and the conductive thin film 26 are patterned by the photolithography. This results in the ferroelectric gate film 25A and the conductive thin film 26A extending over from the lamination 49 in the opposite direction to the N-type impurity diffused layer 22A. Part of the ferroelectric gate film 25A comes in contact with the silicon substrate 20.

A ferroelectric substance like PZT (Lead(Pb) Zirconate Titanate) may be applied for the ferroelectric gate film 25A. However, PZT has no good alignment with silicon, and hence it is desirable to provide an intermediate layer between the ferroelectric gate film 25A and the substrate 20. As to the intermediate layer, fluoride having a fluorite structure of $CaF_2$, $SrF_2$, or the like may be preferably used. Beside PZT, substances suitable for the ferroelectric film 25 include those which have an $ABO_3$ type perovskite structure (A, B are metal elements), such as PLZT (Lead(Pb) Lanthanum Zirconate Titanate), $PbTiO_3$, $BaTiO_3$, and any other $ABO_3$ type ferroelectrics. Alternatively, though not such $ABO_3$ type ferroelectrics, halides such as $BaMgF_4$, $NaCaF_3$, $K_2ZnCl_4$, etc., and chalcogenides such as $Zn_{1-x}Cd_xTe$, $GeTe$, $Sn_2P_2S_6$, etc. may be used.

The patterning of the ferroelectric gate film 25A may be performed by means of wet etching, but preferably dry etching such as ion milling, RIBE (Reactive Ion Beam Etching), RIE (Reactive Ion Etching), etc. excellent in minute workability is applied.

After the ferroelectric gate film 25A and the conductive thin film 26A are shaped, the N-type impurity diffused region 32 are formed in self-alignment, using a mask consisting of those films. This results in a state as shown in FIG. 4G.

Figure 4H:
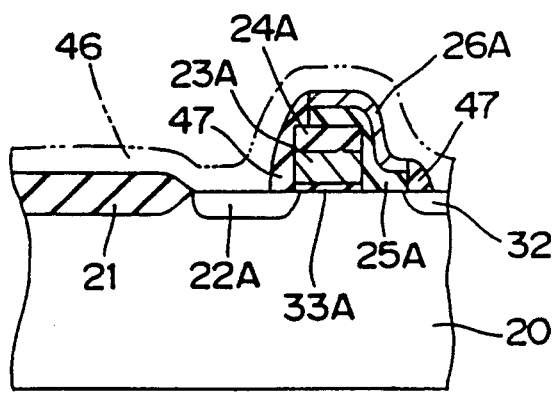

In this state, a silicon oxide film 46 is deposited over the entire surface and then etched back. As a result, the side wall 47 remains on both sides of the lamination between the N-type impurity diffused regions 22A and 32, as shown in FIG. 4H.

Figure 4I:
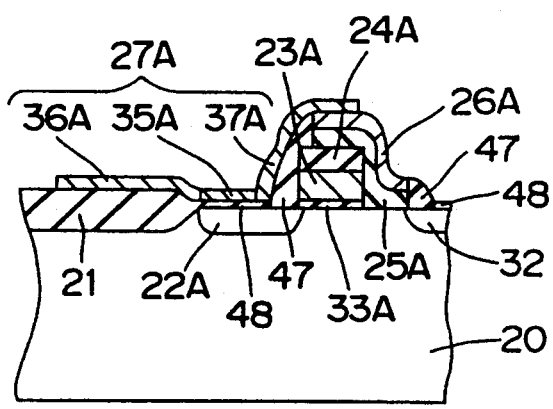

After that, as shown in FIG. 4I, the insulating film 48 is formed covering exposed part of the substrate 20 by means of the thermal oxidation. The semiconductor thin film 27A is then shaped by patterning, being in contact with one end of the conductive thin film 26A above the gate electrode 23A and extending up to a region on the field oxide film 21. The semiconductor thin film 27A may be formed of polysilicon, amorphous silicon, or the like.

In the semiconductor thin film 27A, P-type impurity is applied to a region above the N-type impurity diffused layer 22A to define the channel region 35A therein. N-type impurity is applied to the remaining region to make the drain region 36A and the source region 37A.

Figure 4J:
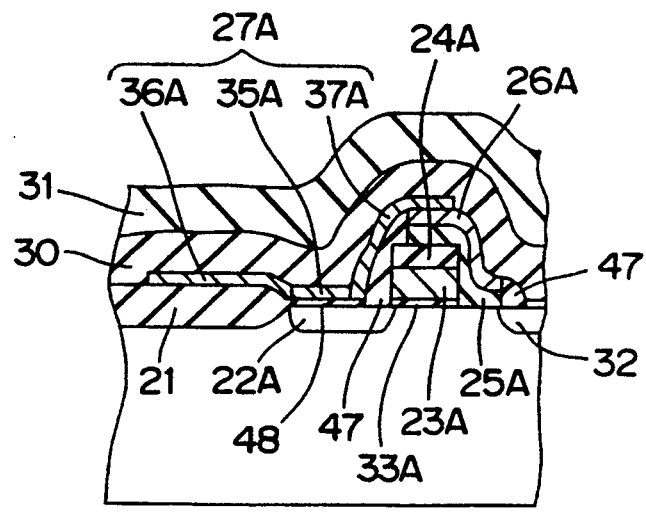

In this state, the layer insulating film 30 is formed of PSG (Phospho-Silicate Glass), BPSG (Boron-doped Phospho-Silicate Glass) or the like. Then, the contact holes 39A and other elements as shown in FIG. 1 are formed, and furthermore, aluminum wiring corresponding to the bit line BL1 and the like are made. After that, the protection film 31 is deposited over the entire surface, and the resultant state is shown in FIG. 4J.

The embodiment described above can be varied as follows.

Figure 5:
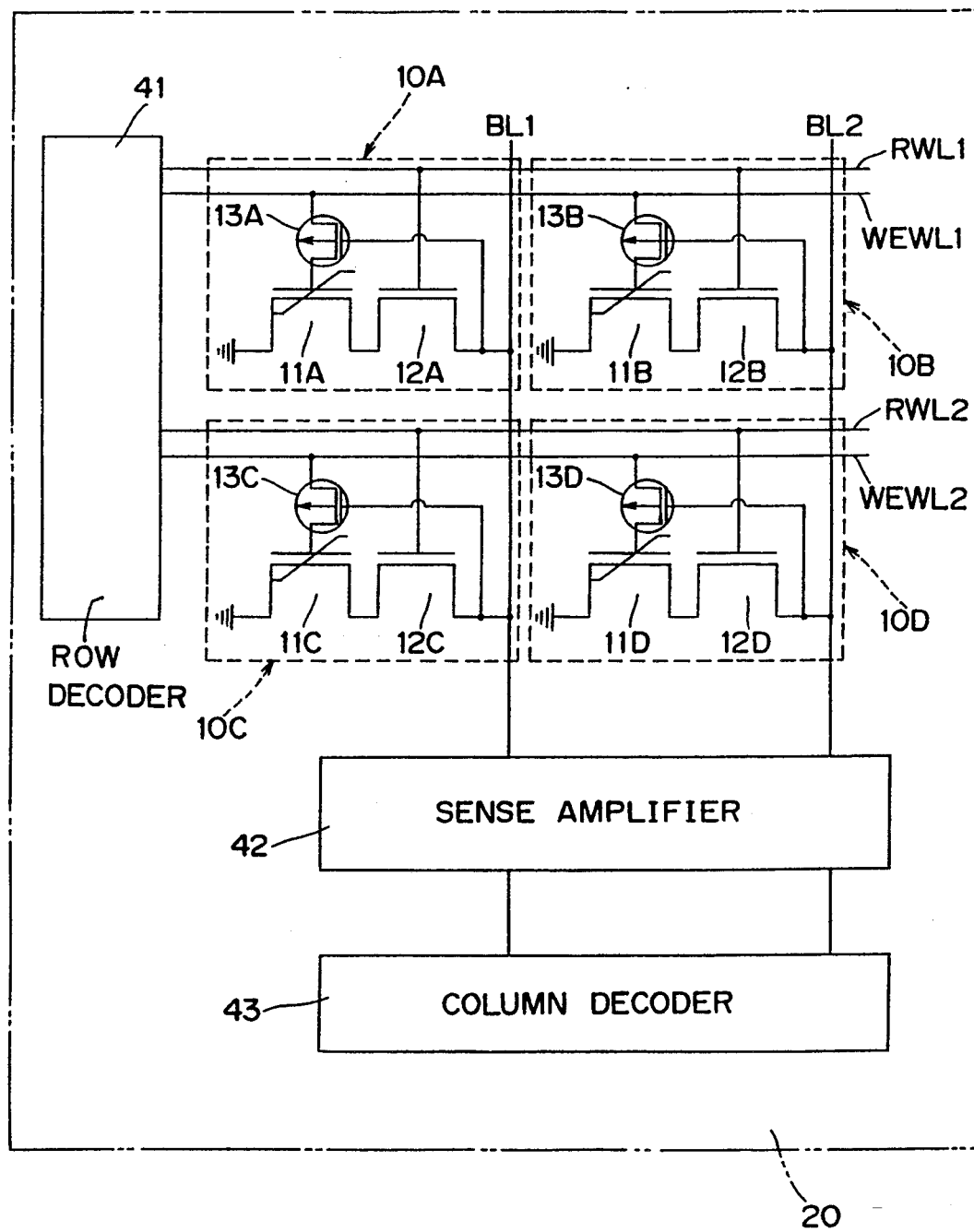
FIG. 5 is a circuit diagram showing in part a variation of an architecture of the embodiment according to the present invention.

For example, in the above embodiment, the MFSFET and the reading MOSFET constitute a single split-type FET having its gate divided into two so as to reduce the required area of the substrate 20. Alternatively, the silicon substrate 20 may include pairs of diffused layers so that each of those pairs acts as a source and a source for each transistor. A circuit diagram of this case is shown in FIG. 5. In FIG. 5, the same reference characters designate corresponding components in FIG. 3.

Figure 6:
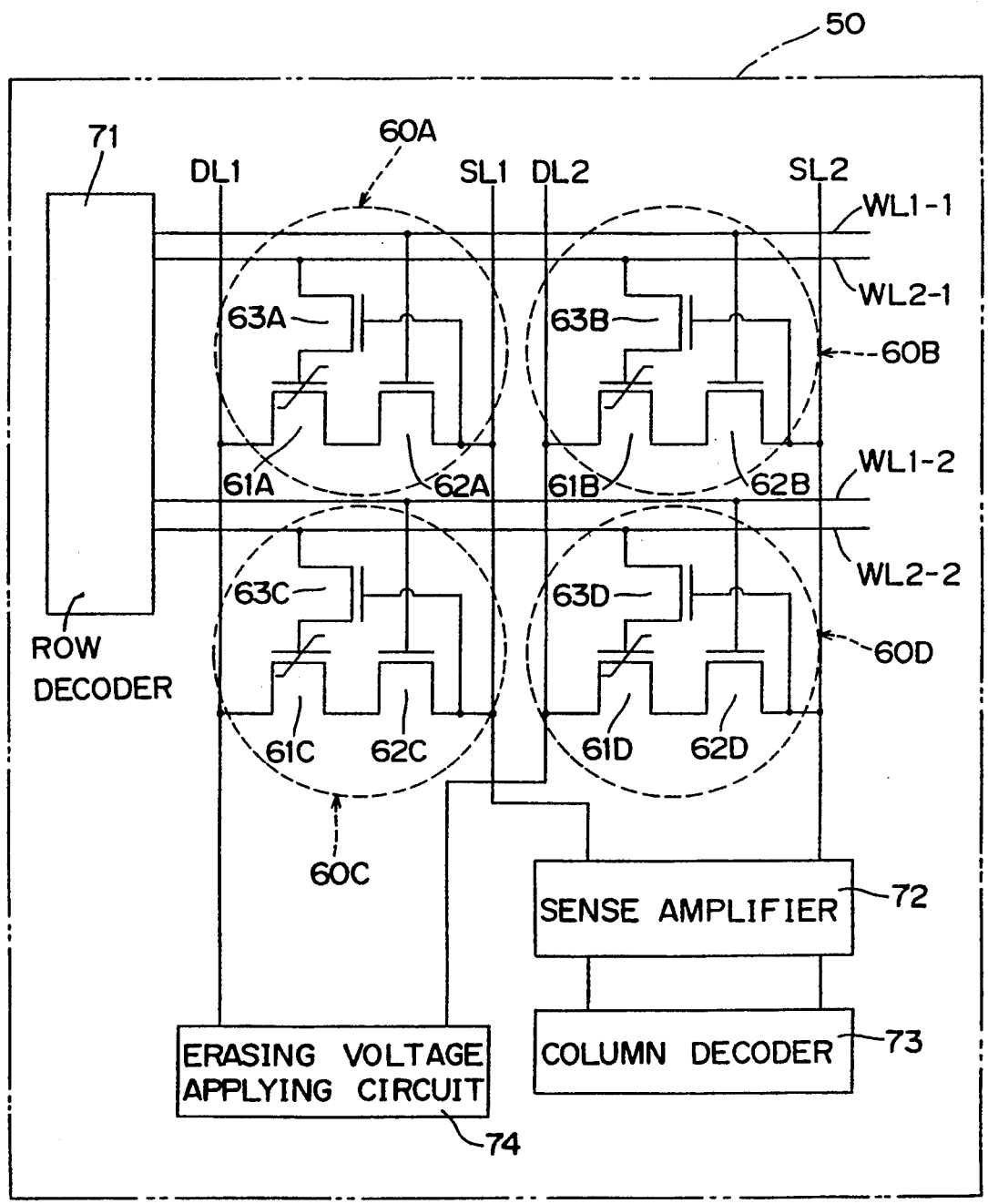
FIG. 6 is a circuit diagram showing in part a nonvolatile semiconductor memory device of another embodiment according to the present invention.

FIG. 6 is a circuit diagram showing a nonvolatile semiconductor memory device of another preferred embodiment according to the present invention.

The nonvolatile semiconductor memory device includes memory cells 60A, 60B, 60C, 60D and so forth (referred to as "memory cell 60" en bloc hereinafter) aligned in a matrix manner on a semiconductor substrate 50. Although FIG. 6 illustrates only four of the memory cells 60, practically about 100,000 to 1,000,000 of memory cells 60 are aligned in rows and columns in a matrix manner on the semiconductor substrate 50.

The memory cells 60A, 60B, 60C, 60D and so forth consist of storing field effect transistors MFSFETs 61A, 61B, 61C, 61D and so forth (referred to as "MFSFET 61" en bloc hereinafter) having their respective ferroelectric gate films, reading MOS field effect transistors MOSFETs 62A, 62B, 62C, 62D and so forth (referred to as "MOSFET 62" en bloc hereinafter) connected in series to the MFSFET 61A, 61B, 61C, 61D and so forth, and writing and erasing MOS field effect transistors MOSFETs, 63A, 63B, 63C, 63D and so forth (referred to as "MOSFET 63" en bloc hereinafter), connected to gates of the MFSFETs 61A, 61B, 61C, 61D and so forth. The MFSFET 61, MOSFET 62 and MOSFET 63 are all N-channel transistors, each of which has a structure where N-type impurity regions acting as a source and a drain are formed in a surface of the semiconductor substrate 50.

The MFSFETs 61A, 61B, 61C, 61D and so forth have their respective drains connected to data lines DL1, DL2 and so forth, respectively. The MOSFETs 62A, 62B, 62C, 62D and so forth have their respective sources connected to source lines SL1, SL2 and so forth corresponding to bit lines, respectively, and have their respective gate connected to first word lines WL1-1, WL1-2 and so forth, respectively. The MOSFETs 63A, 63B, 63C, 63D and so forth have their respective sources connected to second word lines WL2-1, WL2-2 and so forth. The MOSFETs 63A, 63B, 63C, 63D and so forth have their respective gates connected to the sources of the MOSFETs 62A, 62B, 62C, 62D and so forth, respectively. The first word lines WL1-1, WL1-2 and so forth are corresponding to reading word lines while the second word lines WL2-1, WL2-2 and so forth are corresponding to writing and erasing word lines.

The first word lines WL1-1, WL1-2 and so forth and the second word lines WL2-1, WL2-2 and so forth are connected to a row decoder 71. The source lines SL1, SL2 and so forth are connected to a sense amplifier 72 and a column decoder 73. Moreover, the data lines DL1, DL2 and so forth are connected to an erasing voltage applying circuit 74.

A method of driving the above-mentioned nonvolatile semiconductor memory device will now be described. A status where the MFSFET 61 is conductive corresponds to a logic "1", and a status where it is in its non-conductive condition corresponds to a logic "0".

Table 2 below represents voltages applied to various elements when the memory cell 60A is selected to write or erase data in the memory cell 60A or to read data from the memory cell 60A.

TABLE 2

|  | WL1-1 | WL1-2 | WL2-1 | WL2-2 | SL1 | SL2 | DL1 | DL2 |
|---|---|---|---|---|---|---|---|---|
| READ | Vcc | 0 | 0 | 0 | SA | 0 | 0 | 0 |
| WRITE | 0 | 0 | Vpp | 0 | Vcc | 0 | 0 | 0 |
| ERASE | 0 | 0 | 0 | 0 | Vcc | 0 | VE | 0 |

Reading

In reading data from the memory cell 60A, the column decoder 73 selects the source line SL1 to supply current SA to the source of the MOSFET 62 of every memory cell 60 connected to the source line SL1. At this time, the MOSFET 63 in every memory cell 60 sharing the source line SL1 is kept in its non-conductive state.

On the other hand, the row decoder 71 selects the first word line WL1-1 to apply voltage Vcc to the gate of the MOSFET 62 of every memory cell 60 connected to the word line WL1-1. This allows the reading MOSFET 62A in the memory cell 60A to turn ON.

The erasing voltage applying circuit 74 keeps all the data lines DL1, DL2 and so forth at the ground potential.

If the data stored in the memory cell 60A is "1" and the MFSFET 61A is conductive, current flows from the source line SL1 via the MOSFET 62A and MFSFET 61A into the data line DL1. Thus, a potential at the source line SL1 drops to the ground potential. If the data stored in the memory cell 60A is "0" and the MFSFET 61A is in its non-conductive state, the potential at the source line SL1 never drops. Thus, a potential variation at the source line SL1 may be amplified and detected by the sense amplifier 72 to read data stored in the memory cell 60A.

At this time, the ground potential is applied to the word line WL2-1, and the MOSFET 63A is kept in its non-conductive state. For the reason, no electric field is applied to the ferroelectric gate film of the MFSFET 61A. Thus, there is no change in a polarization of the ferroelectric gate film. Data reading from the memory cell 60A can be performed without destruction of the data stored in the memory cell 60A.

Since the ground potential is applied to the world line WL1-2, the memory cells 60C and 60D have their respective MOSFETs 62C and 62D kept in their non-conductive states. Thus, no data is read from the memory cell 60C. The source line SL2 is at the ground potential and supplies no potential. Thus, no potential variation at the source line SL2 corresponding to the memory cells 60B and 60D is detected by the sense amplifier 72. Thus, no data is read from the non-selected memory cells.

Alternative to detecting the potential variation at the source line SL1, current flowing in the data line DL1 connected to the memory cell 60A may be detected to read data from the memory cell 60A.

If the current SA is applied commonly to the source lines SL1, SL2 and so forth, data stored in the memory cells 60A, 60B and so forth aligned in the row direction can be read in parallel.

Writing

In writing the data "1" in the memory cell 60A, the row decoder 71, the column decoder 73 and the erasing voltage applying circuit 74 cause all the lines except for the word line WL2-1 and the source line SL1 to be at the ground potential. Then, the row decoder 71 applies programming voltage Vpp to the second word line WL2-1. The column decoder 73 applies voltage Vcc to the source line SL1. The voltage Vcc applied to the source line SL1 allows the MOSFET 63A to be conductive. Thus, in the memory cell 60A, the programming voltage Vpp from the second word line WL2-1 is applied to the ferroelectric gate film of its MFSFET 61A.

In this way, in the MFSFET 61A of the memory cell 60A, a polarization direction in the ferroelectric gate film is to be aligned with a direction from its gate electrode toward the substrate 50. As a result, in the MFSFET 61A, a channel connecting between its source and drain appears to cause the MFSFET 61A to be conductive.

At this time, in the memory cell 60B, the MOSFET 63B is kept in its non-conductive state because the source line SL2 is at the ground potential. Hence, no electric field is applied to the ferroelectric gate film of the MFSFET 61B in the memory cell 60B.

The word line WL2-2 corresponding to the memory cells 60C and 60D is kept at the ground potential, and therefore, no electric field is applied to the ferroelectric gate film of the MFSFET 61 independent of whether the MOSFET 63 is in its conductive state or non-conductive state.

In this way, no electric field is applied to the ferroelectric gate film of the MFSFET 61 in the non-selected memory cells. Thus, no soft write is caused in the non-selected memory cells 60B, 60C and 60D in writing data in the selected memory cell 60A. This is why data in the non-selected memory cells can be assuredly held.

In writing the data "0" in the memory cell 60A, the ground potential is applied to the word line WL2-1, and therefore, if the data stored in the memory cell 60A is initialized to be "0" before writing, the data stored in the memory cell 60A is kept "0" after the writing.

Erasing

In this embodiment, erasing the stored data is performed to the memory cells 60 aligned in the column direction en bloc. Specifically, data stored in the memory cell 60A is erased simultaneous with erasing data stored in other memories like the memory cell 60C which share the data line DL1 and the source line SL1.

More specifically, the column decoder 73 applies the voltage Vcc to the source line SL1. This allows the MOSFETs 63A, 63C and so forth in the memory cells 60A, 60C and so forth sharing the source line SL1 to be conductive. On the other hand, the erasing voltage applying circuit 74 applies erasing voltage VE sufficiently higher than the programming voltage Vpp to the data line DL1. This allows the erasing voltage VE to be applied to the drains of the MFSFETs 61A, 61C and so forth in the memory cells 60A, 60C and so forth which share the data line DL1.

The ground potential is applied to any line other than the lines SL1 and DL1. In each of the MFSFETs 61A, 61C and so forth in the memory cells 60A, 60C and so forth, this allows a sufficiently large electric field to be applied to its ferroelectric gate film in a direction from the semiconductor substrate 50 toward the gate electrode. This, in turn, causes the polarization in the ferroelectric gate film to be aligned in the direction from the semiconductor substrate 50 toward the gate electrode. Then, in the MFSFETs, 61A, 61C and so forth, a channel between the source and the drain disappears, and those transistors turns to their non-conductive states. As a result, data stored in the memory cells 60A, 60C and so forth are forced to be "0". In this way, the data stored in a single line (column) of memory cells 60 sharing the lines SL1 and DL1 are erased en bloc.

In the memory cells 60B, 60D and so forth which share the source line SL2 and the data line DL2, the MOSFET 63 turns to its non-conductive state, and the ground potential is applied from the data line DL2 to the drain of the MFSFET 61. Thus, in the memory cell 60, no electric field is applied to the ferroelectric gate film of the MFSFET 61.

If the voltage Vcc is applied to all the source lines SL1, SL2 and so forth as well as the source line SL1 and the erasing voltage VE is applied to all the data lines DL1, DL2 and so forth as well as the data line DL1, data stored in every memory cell 60 can be erased en bloc.

As has been described, in the structure according to this embodiment, in writing data, the MOSFET 63 in each memory cell 60 is made conductive, and then, an electric field is applied to the ferroelectric gate film of the MFSFET 61 through the MOSFET 63. If the writing voltage Vpp is applied to the gate of the MFSFET 61, the polarization direction in the ferroelectric gate film can be inverted to write the data "1". If the ground potential is applied through the MOSFET 63 to the gate of the MFSFET 61, the polarization direction in the ferroelectric gate film is kept in its initial state, and the data "0" is stored in the memory cell 60.

In this way, in order to write data in the memory cell 60, not a potential at the substrate 50 but that at the gate electrode of the MFSFET 61 may be controlled through the MOSFET 63. Thus, there is no need of providing a well for controlling the potential at the semiconductor substrate 50 of each memory cell 60. This enables the manufacturing process to be simplified and the area of the substrate 50 to be reduced.

Moreover, in writing, erasing or reading data in or from one memory cell 60, no undesired weak electric field is applied to the ferroelectric gate film of the MFSFET 61 in any other memory cell 60 since the substrate 50 is always kept at the ground potential. Hence, the so-called soft write can be effectively prevented in any non-selected memory cell 60. Thus, if the MFSFET 61 is conductive during the reading, sufficient current flows into the MFSFET 61. This enables reliability in the reading to be enhanced.

Also in this embodiment, in the erasing, relatively high erasing voltage VE is applied to the drain of the MFSFET 61. However, unlike voltage application to a well formed in a semiconductor substrate, even if high voltage is applied to the drain formed of a relatively small impurity region, this voltage never affect any other memory cell formed in the semiconductor substrate 50. Thus, also in the erasing, the polarization in the ferroelectric gate film in the MFSFET 61 never change in any memory cell other than the memory cell in which data is to be erased.

Figure 7:
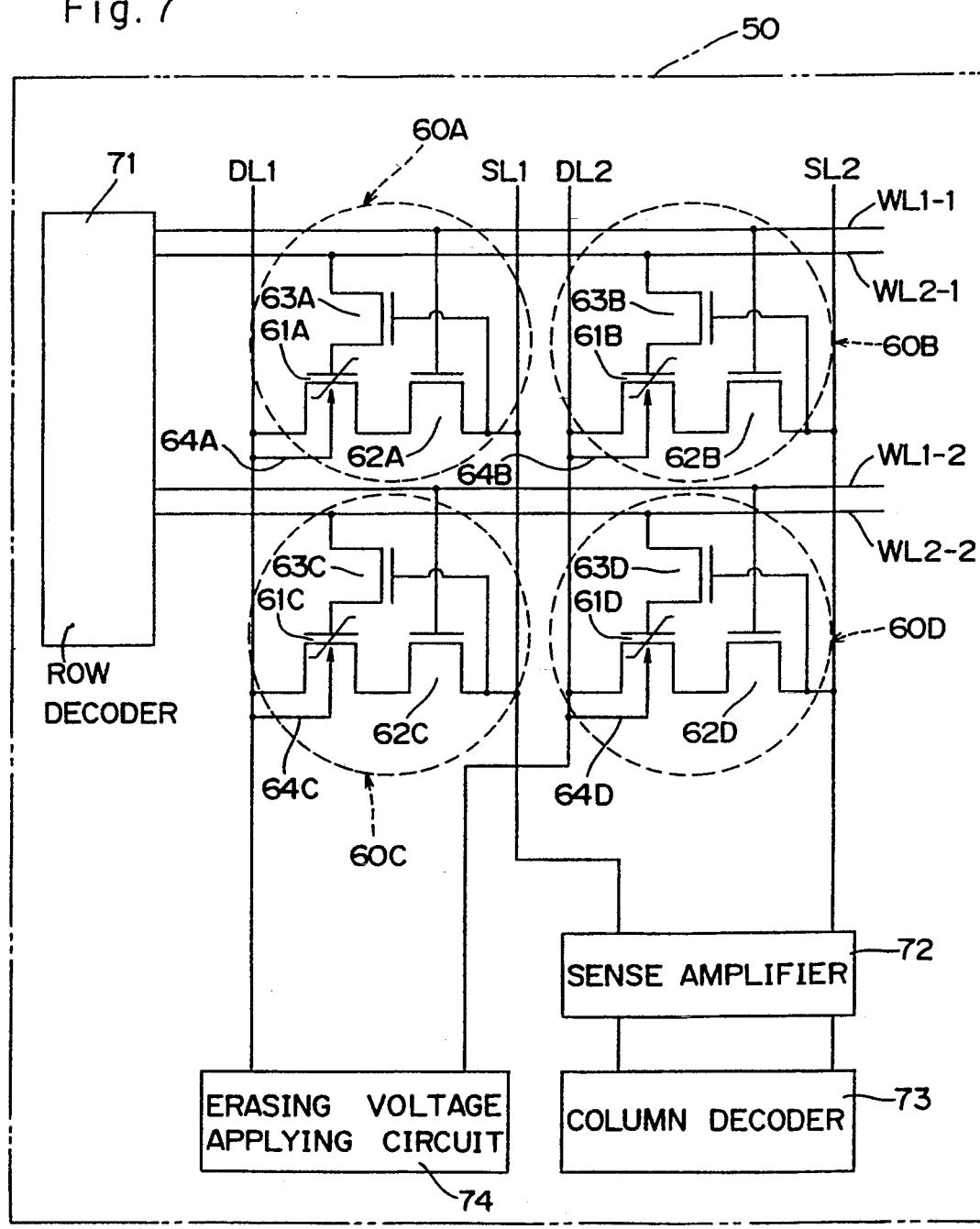
FIG. 7 is a circuit diagram showing in part a nonvolatile semiconductor memory device of still another embodiment according to the present invention.
Figure 8:
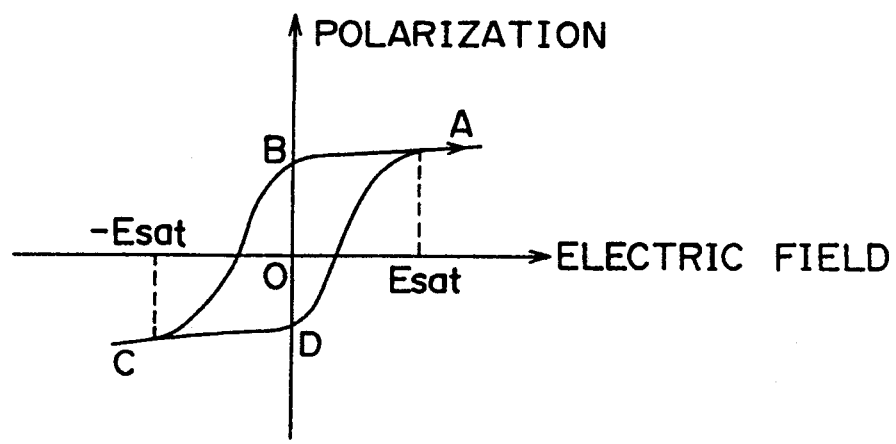
FIG. 8 is a diagram showing a hysteresis characteristic of a ferroelectric substance, relating its polarization to an electric field.
Figure 9:
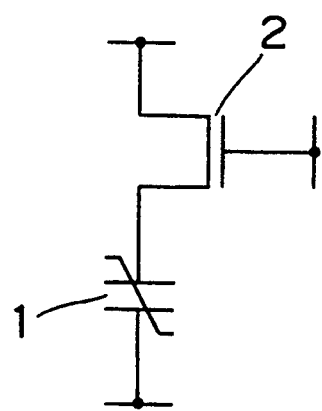
FIG. 9 is a circuit diagram showing a prior art memory cell employing a ferroelectric capacitor.
Figure 10:
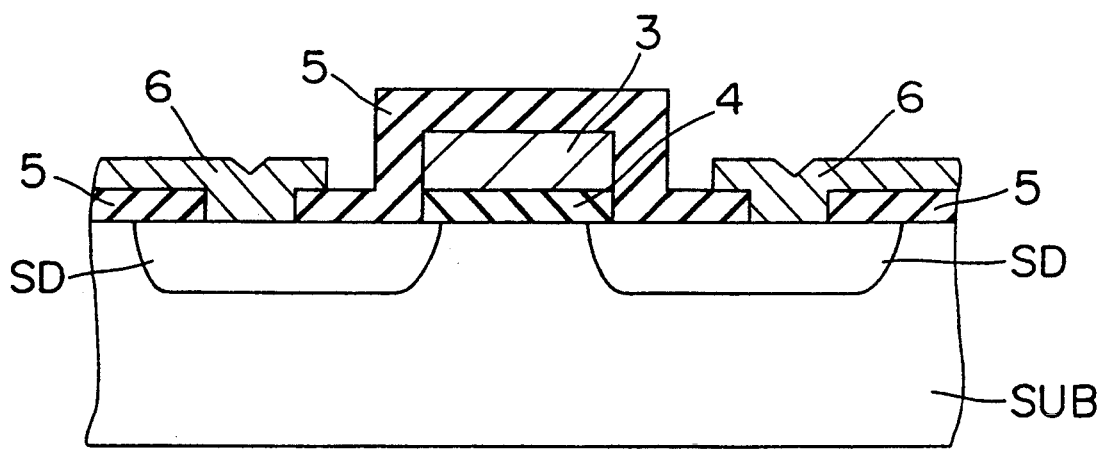
FIG. 10 is a sectional view showing a field effect transistor having a ferroelectric gate film.
Figure 11:
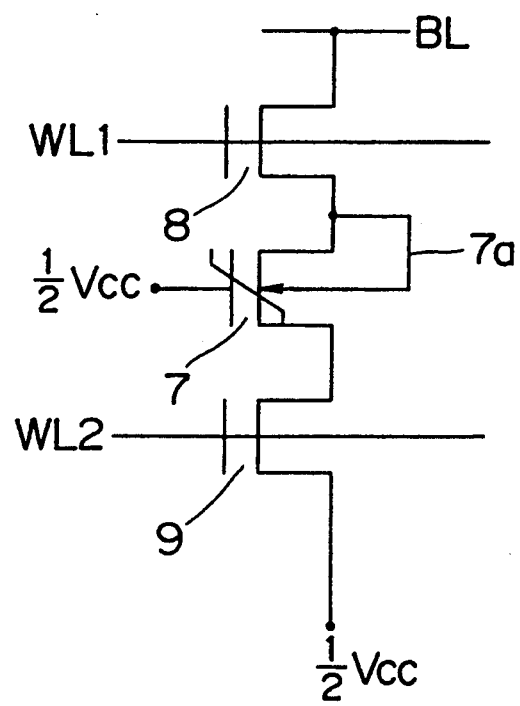
FIG. 11 is a circuit diagram showing a prior art memory cell employing a field effect transistor having a ferroelectric gate film.

FIG. 7 is a circuit diagram showing a structure of a non-volatile semiconductor memory device of still another preferred embodiment according to the present invention. In FIG. 7, same reference numerals designate corresponding parts to those illustrated in FIG. 6. In this embodiment, data erasing can be performed for every single memory cell. For example, even a single bit of data can be erased according to the present invention while a single line of data can be erased en bloc in the structure shown in FIG. 6.

This is why the MFSFETs 61A, 62B, 61C, 61D and so forth respectively contained in the memory cells 60A, 60B, 60C, 60D and so forth are formed respectively in wells 64A, 64B, 64C, 64D and so forth (referred to as "well 64" en bloc hereinafter) made in the semiconductor substrate 50. Those wells 64A, 64B, 64C, 64D and so forth together with drains of the MFSFETs 61A, 61B, 61C, 61D and so forth are connected to data lines DL1, DL2 and so forth.

With such an arrangement, the MFSFETs 61A, 61B, 61C, 61D and so forth have their respective drains electrically isolated from the semiconductor substrate 50.

Now a method of driving the above-mentioned nonvolatile semiconductor memory device will be described. It is assumed that a state where the MFSFET 61 is conductive corresponds to a logic "1" while a state where it is in its non-conductive condition corresponds to a logic "0".

Table 3 below represents voltages applied to various elements when the memory cell 60A is selected to write or erase data in the memory cell 60A and to read the stored data from the memory cell 60A.

TABLE 3

|       | WL1-1 | WL1-2 | WL2-1 | WL2-2 | SL1 | SL2 | DL1 | DL2 |
|-------|-------|-------|-------|-------|-----|-----|-----|-----|
| READ  | Vcc   | 0     | 0     | 0     | SA  | 0   | 0   | 0   |
| WRITE | 0     | 0     | Vpp   | 0     | Vcc | 0   | 0   | 0   |
| ERASE | 0     | 0     | 0     | Vpp   | Vcc | 0   | Vpp | 0   |

The reading and writing are similar to those described in the second embodiment above-mentioned, and therefore, the description of them is omitted.

In erasing data stored in the memory cell 60A, an erasing voltage applying circuit 74 applies programming voltage Vpp to the data line DL1 and applies the ground potential to other data lines. The column decoder 73 applies voltage Vcc to the source line SL1 to make MOSFETs 62A and 62C conductive. Then, the row decoder 71 applies the programming voltage Vpp to the word line WL2-2 and applies the ground potential to the remaining word lines.

In the memory cell 60A, this allows the MOSFET 63A to be conductive. Then, the ground potential is applied to the gate of the MFSFET 61A and the programming voltage Vpp is applied to the well 64A. This, in turn, causes the voltage Vpp to be applied to the ferroelectric gate film of the MFSFET 61A from the well 64A toward its gate electrode. As a result, the polarization in the ferroelectric gate film is aligned with a direction from the semiconductor substrate 50 toward the gate electrode. This causes a channel between the source and the drain of the MFSFET 61A to disappear, and the MFSFET 61A turns to its non-conductive state. In this way, data stored in the memory cell 60A is forced to be "0", and the data stored in the memory cell 60A is completely erased.

On the other hand, in the memory cells 60B and 60D, the MOSFETs 63B and 63D are turned to their non-conductive states and the ground potential is applied to the data line DL2, and hence, no electric field is applied to the ferroelectric gate film of each of the MFSFETs 61B and 61D.

In the memory cell 60C, the programming voltage Vpp is applied to the well 64C, and the MOSFET 63C becomes conductive. However, the programming voltage Vpp equivalent to the voltage applied to the well 64 is applied to the word line WL2-2. Hence, no electric field is applied to the ferroelectric gate film of the MFSFET 61C.

In this way, data stored in the selected memory cell 60A alone is completely erased while data stored in the non-selected memory cells 60B, 60C, 60D and so forth are retained. Moreover, in the erasing, in the memory cells 60B and 60D, the MFSFETs 61B and 61D have their respective gate electrodes electrically disconnected. For the reason, even if the voltage Vpp applied to the wells 64A and 64C affects the wells 64B and 64D, no electric field is applied to the ferroelectric gate film of each of the MFSFETs 61B and 61D. As has been described, no electric field is applied to the ferroelectric gate film contained in the MFSFET 61C of the memory cell 60C. Thus, no soft write is caused in any memory cell except for the memory cell in which data is to be erased during the erasing.

During the writing or the reading, as will be recognized from Table 3, no voltage is applied to the well 64. Thus, no soft write is caused in any non-selected memory cells.

In the erasing as mentioned above, if the ground potential is applied to all the second word lines WL2-1, WL2-2 and so forth, data stored in a single column of the memory cells 60A, 60C and so forth sharing the data line DL1 and the source line SL1 can be erased en bloc.

If the voltage Vcc is applied to all the source line SL1, SL2 and so forth and the voltage Vpp is applied to all the data line DL1, DL2 and so forth, data stored in a single row of the memory cells 60A, 60B and so forth sharing the words line WL1-1 and WL2-1 can be erased en bloc.

Furthermore, if the ground potential is applied to all the second word lines WL2-1, WL2-2 and so forth, the voltage Vcc is applied to all the source lines SL1, SL2 and so forth, and the voltage Vpp is applied to all the data lines DL1, DL2 and so forth, data stored in every memory cell 60 can be erased en bloc.

Although any of the transistors 11, 12, 13; 61, 62, 63 contained in the memory cells 10 and 60, respectively, are of N-channel type in the above-mentioned three preferred embodiments, a conductivity type of each of the transistors constituting the memory cells 10 and 60 can be arbitrarily selected.

Moreover, it is needless that all memory cells contained in a nonvolatile memory device are structured as in the memory cell 10 or 60, but it can be a structure in which the memory cells 10 and 60 described in the above embodiment are utilized for a part of the memory cells.

Although the invention has been described in detail in terms of the preferred embodiments, these are presented as simply examples for specifying technical subjects of the invention. The present invention should be broadly interpreted without limitation to the examples only, and the true spirit and scope of the invention should be defined by the description of the appended claims.

What is claimed is:

1. A nonvolatile semiconductor memory device comprising:
   a memory cell, including
   a storing field effect transistor having a ferroelectric gate film formed on a semiconductor substrate, and a gate electrode formed on the ferroelectric gate,
   a reading transistor connected in series to said storing field effect transistor and
   a writing and erasing transistor connected to the gate electrode of said storing field effect transistor;
   writing means for writing data to be written into said memory cell by making said writing and erasing transistor conductive and applying a writing voltage corresponding to the data to be written to the gate electrode of said storing field effect transistor through said writing and erasing transistor so as to invert a direction of a polarization of said ferroelectric gate film or retain the polarization in an initial direction in accordance with the data to be written;
   reading means for reading from said memory cell data to be read, said reading means reading the data to be read by making said reading transistor conductive and checking whether a series circuit of said storing field effect transistor and said reading transistor is conductive or not; and
   erasing means for erasing from said memory cell data to be erased, said erasing means erasing the data to be erased by applying an erasing electric field to said ferroelectric gate film to turn the polarization to a specified direction.

2. A nonvolatile semiconductor memory device according to claim 1, wherein
   said writing and erasing transistor is electrically insulated from said semiconductor substrate.

3. A nonvolatile semiconductor memory device according to claim 2, wherein
   said writing and erasing transistor is a thin film transistor having its channel, drain and source made by selectively applying impurities to a semiconductor thin film.

4. A nonvolatile semiconductor memory device according to claim 3, wherein
   said reading transistor includes an impurity region formed on the semiconductor substrate; and
   the channel of said thin film transistor is provided on said impurity region with an insulating film intervening between them.

5. A nonvolatile semiconductor memory device according to claim 1, wherein
   said writing and erasing transistor is formed on said semiconductor substrate.

6. A nonvolatile semiconductor memory device according to claim 1, wherein
   said storing field effect transistor is formed in a well made in said semiconductor substrate.

7. A nonvolatile semiconductor memory device according to claim 1, wherein
   a pair of impurity regions are formed in the semiconductor substrate, and a gate of said storing field effect transistor and a gate of said reading transistor are provided between the pair of impurity regions.

8. A nonvolatile semiconductor memory device according to claim 1, wherein said reading means includes means for applying a specified potential to said storing field effect transistor from a side of said storing field effect transistor opposite to said reading transistor, and means for detecting a variation of a potential of said reading transistor at a side of said reading transistor opposite to said storing field effect transistor.

9. A nonvolatile semiconductor memory device according to claim 1, wherein
   said writing and erasing transistor is electrically insulated from said semiconductor substrate; and
   said erasing means makes said writing and erasing transistor conductive and applies an erasing voltage to the gate electrode of said storing field effect transistor through said writing and erasing transistor to turn the polarization of said ferroelectric gate film to the specified direction.

10. A nonvolatile semiconductor memory device according to claim 9, wherein said erasing voltage has a polarity reverse to the polarity of said writing voltage.

11. A nonvolatile semiconductor memory device according to claim 1, wherein
    said writing and erasing transistor is formed in said semiconductor substrate; and
    said erasing means makes said writing and erasing transistor conductive, applies a specified potential to the gate electrode of said storing field effect transistor through said writing and erasing transistor, and applies the erasing voltage to said storing field effect transistor from a side of said storing field effect transistor opposite to said reading transistor to turn the polarization of said ferroelectric gate film to the specified direction.

12. A nonvolatile semiconductor memory device according to claim 11, wherein
    said erasing voltage is voltage sufficiently higher than said writing voltage.

13. A nonvolatile semiconductor memory device according to claim 1, wherein
    said storing field effect transistor is formed in a well made in said semiconductor substrate; and
    said erasing means makes said writing and erasing transistor conductive, applies a specified potential to the gate electrode of said storing field effect transistor through said writing and erasing transistor, and applies an erasing voltage to said well to turn the polarization of said ferroelectric gate film to the specified direction.

14. A nonvolatile semiconductor memory device according to claim 13, wherein
    said erasing voltage is almost equal to said writing voltage.

15. A nonvolatile semiconductor memory device according to claim 1, wherein a gate of the writing and erasing transistor is connected to a drain of the reading transistor.

16. A nonvolatile memory device according to claim 1, wherein the initial direction is the specified direction and said writing means applies the writing voltage to the gate electrode of said storing field effect transistor through said writing and erasing transistor so as to retain the polarization of said ferroelectric gate film in the specified direction or invert the direction of polarization, in accordance with the data to be written.

17. A nonvolatile memory device according to claim 16, wherein the writing voltage to invert the direction of polarization is opposite in polarity to the erasing voltage, and the writing voltage to retain the polarization in the specified direction is intermediate of the writing voltage to invert the direction of polarization and the erasing voltage.

18. A nonvolatile memory device according to claim 17, wherein the writing voltage to retain the polarization in the specified direction is a ground potential.

19. A nonvolatile semiconductor memory device, comprising:
a semiconductor substrate;
a plurality of memory cells aligned in rows and columns in a matrix array on said semiconductor substrate, each memory cell including:
a storing field effect transistor having a ferroelectric gate film formed on said semiconductor substrate,
a gate electrode formed on the ferroelectric gate film,
a reading transistor connected in series to said storing field effect transistor, and
a writing and erasing transistor connected to the gate electrode of said storing field effect transistor;
a separate corresponding reading word line for each row of said rows, each reading word line connected to a gate of said reading transistor in each memory cell of the memory cells aligned in the row to which the reading word line corresponds;
a separate corresponding writing and erasing word line for each row of said rows, each writing and erasing word line connected to said writing and erasing transistor at a side of said writing and erasing transistor opposite to said storing field effect transistor in each memory cell of the memory cells aligned in the row to which the writing and erasing word line corresponds;
a separate corresponding bit line for each column of said columns, each bit line connected to said reading transistor at a side of said reading transistor opposite to said storing field effect transistor in each memory cell of the memory cells aligned in said each column;
means for applying a voltage provided on any one of said bit lines, to a gate of said writing and erasing transistor of each of the memory cells aligned in the column to which the one bit line corresponds;
writing means for selecting any first selected memory cell from among the memory cells of the matrix array and writing data in the first selected memory cell, said writing means including:
means for applying a first specified voltage to the bit line connected to the first selected memory cell to make the writing and erasing transistor thereof conductive, and
writing voltage applying means for applying a writing voltage to the writing and erasing word line connected to the first selected memory cell to invert a direction of a polarization of said ferroelectric gate film or retain the polarization in an initial direction, in accordance with data to be written;
reading means for selecting any second selected memory cell from among the memory cells of the matrix array and reading data from the second selected memory cell, said reading means including:
means for applying a second specified voltage to the reading word line connected to the second selected memory cell to make the reading transistor thereof conductive, and
data detecting means for checking whether a series circuit of said reading transistor and said storing field effect transistor of the second selected memory cell is conductive or not; and
erasing means for selecting any third selected memory cell from among the memory cells of the matrix array and erasing data from the third selected memory cell, said erasing means including:
means for applying a third specified voltage to the bit line connected to the third selected memory cell to make the writing and erasing transistor thereof conductive, and
means for applying an erasing electric field to the ferroelectric gate film contained in the storing field effect transistor of the third selected memory cell to turn the polarization of said ferroelectric gate film to a specified direction.

20. A nonvolatile semiconductor memory device according to claim 19, wherein said data detecting means includes means for applying a specified potential to said storing field effect transistor of said second selected memory cell from a side of said storing field effect transistor opposite to said reading transistor of said second selected memory cell, and means for detecting a variation of a potential on said bit line.

21. A nonvolatile semiconductor memory device according to claim 19, wherein
said writing and erasing transistor is electrically insulated from said semiconductor substrate.

22. A nonvolatile semiconductor memory device according to claim 21, wherein
said writing and erasing transistor is a thin film transistor having its channel, drain and source made by selectively applying impurities into a semiconductor thin film.

23. A nonvolatile semiconductor memory device according to claim 21, wherein
said reading transistor includes an impurity region formed in the semiconductor substrate; and
the channel of said thin film transistor is provided on said impurity region with an insulating film intervening between them.

24. A nonvolatile semiconductor memory device according to claim 21, wherein said erasing electric field applying means includes means for applying an erasing voltage to said writing and erasing word line connected to the third selected memory cell so that the erasing electric field is applied to said ferroelectric gate film.

25. A nonvolatile semiconductor memory device according to claim 24, wherein
said erasing voltage is a voltage reverse in polarity to said writing voltage.

26. A nonvolatile semiconductor memory device according to claim 19, wherein
said writing and erasing transistor is formed in said semiconductor substrate.

27. A nonvolatile semiconductor memory device according to claim 26, further comprising a separate data line for each of said columns, connected to said storing field effect transistor at a side of said storing field effect transistor opposite to said reading transistor in each of the memory cells aligned in said each column;

said erasing electric field applying means including means for applying a specified potential to said writing and erasing word line connected to the third selected memory cell, and means for applying an erasing voltage to said data line connected to the third selected memory cell so that the erasing electric field is applied to said ferroelectric gate film.

28. A nonvolatile semiconductor memory device according to claim 27, wherein
said erasing voltage is voltage sufficiently higher than said writing voltage.

29. A nonvolatile semiconductor memory device according to claim 19, wherein
said storing field effect transistor is formed in a well made in said semiconductor substrate.

30. A nonvolatile semiconductor memory device according to claim 29, further comprising a separate data line for each column connected to said well in each of the memory cells aligned in said each column;
said erasing electric field applying means including means for applying a specified potential to said data line connected to the third selected memory cell so that the erasing electric field is applied to said ferroelectric gate film.

31. A nonvolatile semiconductor memory device according to claim 30, wherein
said erasing voltage is almost equal to said writing voltage.

32. A nonvolatile semiconductor memory device according to claim 30, wherein
said erasing means further includes means for applying said erasing voltage to a writing and erasing word line connected to any memory cell not selected.

33. A nonvolatile semiconductor memory device according to claim 19, wherein
a pair of impurity regions are formed in the semiconductor substrate, and a gate of said storing field effect transistor and a gate of said reading transistor are provided between the pair of impurity regions.

34. A nonvolatile semiconductor memory device according to claim 19, wherein said erasing means selects and erases data from the memory cells one memory cell at a time.

35. A nonvolatile semiconductor memory device according to claim 19, wherein said erasing means selects and erases data from one column of the memory cells en bloc.

36. A nonvolatile semiconductor memory device according to claim 19, wherein said erasing means selects and erases data from one row of the memory cells en bloc.

37. A nonvolatile semiconductor memory device according to claim 19, wherein said erasing means selects and erases data from all of the memory cells aligned in the matrix array en bloc.

38. A nonvolatile semiconductor memory device according to claim 19, wherein the gate of the writing and erasing transistor is connected to the drain of the reading transistor.

39. A nonvolatile semiconductor memory device according to claim 19, wherein said writing means includes
means, in selecting the first selected memory cell and writing data in the first selected memory cell, for applying a fourth specified voltage to the word lines connected to the non-selected memory cells, said further specified voltage being such a voltage that the polarization direction of the ferroelectric gate film is kept unchanged; and
means in selecting the first selected memory cell and writing data in the first selected memory cell, for applying to the bit lines connected to the non-selected memory cells a voltage to make the writing and erasing transistor non-conductive.

40. A nonvolatile semiconductor memory device according to claim 19, wherein said erasing means includes:
means, in selecting the third selected memory cell and erasing data in the third selected memory cell, for applying a fifth specified voltage to the word lines connected to the non-selected memory cells, said fifth specified voltage being such a voltage that the polarization direction of the ferroelectric gate film is kept unchanged; and
means, in selecting the third selected memory cell and erasing data in the third selected memory cell, for applying to the bit line connected to the non-selected memory cell a voltage to make the writing and erasing transistor non-conductive.

41. A nonvolatile memory device according to claim 19, wherein the initial direction is the specified direction and said writing voltage applying means applies the writing voltage to the writing and erasing word line connected to the first selected memory cell to retain the polarization in the specified direction or invert the direction of polarization of said ferroelectric gate film, in accordance with the data to be written.

42. A nonvolatile memory device according to claim 41, wherein the writing voltage to invert the direction of polarization is opposite in polarity to the erasing voltage, and the writing voltage to retain the polarization in the specified direction is intermediate of the writing voltage to invert the direction of polarization and the erasing voltage.

43. A nonvolatile memory device according to claim 42, wherein the writing voltage to retain the polarization in the specified direction is a ground potential.

44. A method of driving a nonvolatile semiconductor memory device which includes memory cells disposed in rows and columns of a matrix array on a semiconductor substrate, each memory cell of the matrix array including a storing field effect transistor having a ferroelectric gate film formed on the semiconductor substrate and a gate electrode formed on the ferroelectric gate film, a reading transistor connected in series to said storing field effect transistor, and a writing and erasing transistor connected to the gate electrode of said storing field effect transistor;

a separate corresponding reading word line for each row of said rows, each reading word line connected to a gate of said reading transistor in each of the memory cells aligned in said each row;

a separate corresponding writing and erasing word line for each row of said rows, each writing and erasing word line connected to said writing and erasing transistor at a side of said writing and erasing transistor opposite to said storing field effect transistor in each of the memory cells aligned in said each row;

a separate corresponding bit line for each column of said columns, each bit line connected to said reading transistor at a side of said reading transistor opposite to said storing field effect transistor in each of the memory cells aligned in said each column; and means for applying a voltage provided on any one of said bit lines, to a gate of said writing and erasing transistor of each of the memory cells aligned in the column to which the one bit line corresponds;

said method comprising the steps of:

in selecting any memory cell and writing data in the selected memory cell, applying a writing voltage to said writing and erasing word line connected to the selected memory cell to invert a direction of a polarization of said ferroelectric gate film or retain the polarization in an initial direction in accordance with data to be written, and further applying a first specified voltage to said bit line connected to the selected memory cell to make said writing and erasing transistor conductive;

in selecting any memory cell and reading data from the memory cell, applying a second specified voltage to said reading word line connected to the selected memory cell to make said reading transistor conductive, and checking whether a series circuit of said reading transistor and said storing field effect transistor in the selected memory cell is conductive or not; and in selecting any memory cell and erasing data in the memory cell, applying a third specified voltage to said bit line connected to the selected memory cell to make said writing and erasing transistor conductive, and applying an erasing electric field to said ferroelectric gate film contained in said storing field effect transistor in the selected memory cell to turn the polarization thereof to a specified direction.

45. A method according to claim 44, wherein said writing and erasing transistor is electrically insulated from said semiconductor substrate, and in selecting any memory cell and erasing data in the selected memory cell, an erasing voltage is applied to said writing and erasing word line connected to the selected memory cell to turn the polarization of said ferroelectric gate film to the specified direction.

46. A method according to claim 45, wherein said erasing voltage is a voltage reverse in polarity to said writing voltage.

47. A method according to claim 44, wherein said writing and erasing transistor is formed in said semiconductor substrate;

said semiconductor memory device further includes a separate corresponding data line for each column of said columns connected to said storing field effect transistor at the side of the storing field effect transistor opposite to said reading transistor in each of the memory cells aligned in said each column; and in selecting any memory cell and erasing data from the memory cell, a specified potential is applied to said writing and erasing word line connected to the selected memory cell, and an erasing voltage is applied to said data line connected to the selected memory cell to turn the polarization of said ferroelectric gate film to the specified direction.

48. A method according to claim 47, wherein said erasing voltage is a voltage sufficiently higher than said writing voltage.

49. A method according to claim 44, wherein said storing field effect transistor is formed in a well formed in said semiconductor substrate;

said semiconductor memory device further includes a separate corresponding data line for each of the columns connected to said well in each of the memory cells aligned in the column; and in selecting any memory cell and erasing data in the selected memory cell, a specified potential is applied to said writing and erasing word line connected to the selected memory cell, and an erasing voltage is applied to said data line connected to the selected memory cell to turn the polarization of the ferroelectric gate film to the specified direction.

50. A method according to claim 49, wherein said erasing voltage is almost equal to said writing voltage.

51. A method according to claim 49, wherein in selecting any memory cell and erasing data in the selected memory cell, said erasing voltage is applied to a writing and erasing word line connected to any memory cell not selected.

52. A method according to claim 44, wherein in erasing data, only one of the memory cells is selected at a time.

53. A method according to claim 44, wherein in erasing data, the memory cells aligned in the column direction are selected en bloc.

54. A method according to claim 44, wherein in erasing data, the memory cells aligned in the row direction are selected en bloc.

55. A method according to claim 44, wherein in erasing data, the memory cells aligned in a matrix manner are all selected en bloc.

56. A method according to claim 44, further comprising the steps of:

in selecting any memory cell and writing data in the selected memory cell, applying a fourth specified voltage to the word lines connected to the non-selected memory cells, said first specified voltage being such voltage that the polarization direction of the ferroelectric gate film is kept uncharged; and in selecting any memory cell and writing data in the selected memory cell, applying to the bit line connected to the non-selected memory cell a voltage to make the writing and erasing transistor non-conductive.

57. A method according to claim 44, further comprising the steps of:

in selecting any memory cell and erasing data in the selected memory cell, applying a fifth specified voltage to the word lines connected to the non-selected memory cells, said fifth specified voltage being such a voltage that the polarization direction of the ferroelectric gate film is kept unchanged; and in selecting any memory cell and erasing data in the selected memory cell, applying to the bit line connected to the non-selected memory cell a voltage to make the writing and erasing transistor non-conductive.

58. A method according to claim 44, wherein the initial direction of polarization is the specified direction, so that in selecting any memory cell and writing data in the selected memory cell, the writing voltage is applied to the writing and erasing word line connected to the selected memory cell so as to retain the polarization of said ferroelectric gate film in the specified direction or invert the direction of polarization, in accordance with the data to be written.

59. A method of driving a nonvolatile semiconductor memory device which includes memory cells disposed in rows and columns of a matrix array on a semiconductor substrate, each memory cell of the matrix array including a storing field effect transistor having a ferroelectric gate film formed on the semiconductor substrate and a gate electrode formed on the ferroelectric gate film, a reading transistor connected in series to the storing transistor, and a writing and erasing transistor connected to the gate electrode of the storing transistor; a separate corresponding reading word line for each row, each reading word line connected to a gate of the reading transistor in each memory cell aligned in the row to which the reading word line corresponds; a separate corresponding writing and erasing word line for row, each writing and erasing word line connected to the writing and erasing transistor at a side of the writing and erasing transistor opposite to the storing transistor in each memory cell aligned in the row to which the writing and erasing word line corresponds; a separate corresponding bit line for each column, each bit line connected to the reading transistor at a side of the reading transistor opposite to the storing transistor in each memory cell aligned in the column to which the bit line corresponds; and means for applying a voltage provided on any one of the bit lines to a gate of the writing and erasing transistor of each memory cell aligned in the column to which the one bit line corresponds, said method comprising the steps of:

(a) selecting a memory cell from among the memory cells of the matrix array and reading data from the selected memory cell, including applying a first specified voltage to the reading word line connected to the selected memory cell to make the reading transistor thereof conductive, and checking whether a series circuit of the reading transistor and the storing transistor of the selected memory cell is conductive or not;

(b) selecting a memory cell from among the memory cells of the matrix array, and erasing data in the selected memory cell, including applying a second specified voltage to the bit line connected to the selected memory cell to make the writing and erasing transistor thereof conductive, and applying an erasing electric field to the ferroelectric gate film contained in the storing transistor in the selected memory cell to turn the polarization thereof to a specified direction; and (c) after said step (b), selecting the memory cell selected in said step (b), and writing data in the selected memory cell, including further applying a third specified voltage to the bit line connected to the selected memory cell to make the writing and erasing transistor conductive, and applying a writing voltage to the writing and erasing word line connected to the selected memory cell to retain the polarization of the ferroelectric gate film in the specified direction or invert the direction of polarization, in accordance with the data to be written.

60. A method according to claim 59, wherein the writing voltage to invert the direction of polarization is opposite in polarity to the erasing voltage, and the writing voltage to retain the polarization in the specified direction is intermediate of the writing voltage to invert the direction of polarization and the erasing voltage.

61. A method according to claim 60, wherein the writing voltage to retain the polarization in the specified direction is a ground potential.

* * * * *